(12) United States Patent
Masuda et al.

(10) Patent No.: US 11,996,314 B2
(45) Date of Patent: May 28, 2024

(54) PROCESSING APPARATUS FOR ELECTRONIC COMPONENT

(71) Applicant: UENO SEIKI CO., LTD., Fukuoka (JP)

(72) Inventors: Takayuki Masuda, Fukuoka (JP); Yoshimasa Yodogawa, Fukuoka (JP)

(73) Assignee: UENO SEIKI CO., LTD., Fukuoka (JP)

( * ) Notice: Subject to any disclaimer, the term of this patent is extended or adjusted under 35 U.S.C. 154(b) by 0 days.

(21) Appl. No.: 18/044,527

(22) PCT Filed: Sep. 3, 2021

(86) PCT No.: PCT/JP2021/032544
§ 371 (c)(1),
(2) Date: Mar. 8, 2023

(87) PCT Pub. No.: WO2022/054728
PCT Pub. Date: Mar. 17, 2022

(65) Prior Publication Data
US 2023/0274971 A1   Aug. 31, 2023

(30) Foreign Application Priority Data

Sep. 9, 2020 (JP) .................................. 2020-151137

(51) Int. Cl.
*H01L 21/68* (2006.01)
*H01L 21/67* (2006.01)
(Continued)

(52) U.S. Cl.
CPC .. *H01L 21/68714* (2013.01); *H01L 21/67259* (2013.01); *H01L 21/6735* (2013.01); *H01L 21/68* (2013.01); *H05K 13/082* (2018.08)

(58) Field of Classification Search
CPC ......... H01L 21/68714; H01L 21/67259; H01L 21/6735; H01L 21/68; H05K 13/082
See application file for complete search history.

(56) References Cited

U.S. PATENT DOCUMENTS 4,844,680 A * 7/1989 Kawata .................. B65G 65/00
                                                    414/661
4,932,828 A * 6/1990 Katae ................... B23Q 7/1426
                                                    414/280
(Continued)

FOREIGN PATENT DOCUMENTS

JP    3-256622 A     11/1991
JP    2005-302919 A  10/2005
(Continued)

OTHER PUBLICATIONS

Written Opinion (PCT/ISA/237) issued by the International Searching Authority dated Nov. 2, 2021 in corresponding International Application No. PCT/JP2021/032544.
(Continued)

*Primary Examiner* — Mohammed Shamsuzzaman
(74) *Attorney, Agent, or Firm* — Sughrue Mion, PLLC

(57) ABSTRACT

A processing apparatus for an electronic component includes a component holder configured to hold the electronic component, a turning unit configured to hold the component holder toward an outside of a predetermined circular track, a turning drive unit configured to turn the turning unit around a first axis along a central axis of the circular track, and a rotation drive unit provided on the turning unit and configured to rotate the component holder around a second axis along a radial direction of the circular track.

8 Claims, 15 Drawing Sheets

(51) Int. Cl.
   *H01L 21/673* (2006.01)
   *H01L 21/687* (2006.01)
   *H05K 13/08* (2006.01)

(56) References Cited

U.S. PATENT DOCUMENTS

| | | | |
|---|---|---|---|
| 5,090,113 A * | 2/1992 | Umetsu | B23P 19/001 |
| | | | 29/709 |
| 5,289,625 A * | 3/1994 | Umetsu | B23P 19/001 |
| | | | 414/811 |
| 11,317,549 B2 * | 4/2022 | Kito | H05K 13/0409 |
| 2018/0037421 A1 * | 2/2018 | Tam | H04W 4/70 |
| 2023/0274971 A1 * | 8/2023 | Masuda | H01L 21/68 |
| | | | 438/464 |

FOREIGN PATENT DOCUMENTS

| | | | | |
|---|---|---|---|---|
| JP | 2005302919 A * | 10/2005 | | H01L 21/67265 |
| JP | 2016-092391 A | 5/2016 | | |
| JP | 2017-216311 A | 12/2017 | | |
| JP | 2017216311 A * | 12/2017 | | H01L 21/68 |
| JP | WO2020044580 A1 * | 11/2018 | | H01L 24/75 |
| JP | 2019-36015 A | 3/2019 | | |
| JP | 6788922 B1 * | 11/2020 | | H01L 21/67265 |
| JP | 6836816 B1 * | 3/2021 | | B65G 29/00 |
| JP | 6860249 B1 * | 4/2021 | | H01L 21/67265 |
| JP | 2021174869 A * | 11/2021 | | H01L 21/67265 |
| WO | 2014-087682 A1 | 6/2014 | | |
| WO | 2016-084407 A1 | 6/2016 | | |
| WO | WO-2016084407 A1 * | 6/2016 | | H01L 21/68 |
| WO | WO-2018147147 A1 * | 8/2018 | | B29C 35/08 |

OTHER PUBLICATIONS

Search Report (PCT/ISA/210) dated Nov. 2, 2021 by the International Searching Authority for International Patent Application No. PCT/J P2021/032544.

Written Opinion (PCT/ISA/237) dated Nov. 2, 2021 by the International Searching Authority for International Patent Application No. PCT/J P2021/032544.

Notice of Refusal dated Dec. 12, 2020, issued by the Japanese Patent Office for Japanese Patent Application No. 2020-151137.

Notice of Refusal (2nd OA) dated Apr. 5, 2021, issued by the Japanese Patent Office for Japanese Patent Application No. 2020-151137.

Decision to Grant dated Aug. 19, 2021, issued by the Japanese Patent Office for Japanese Patent Application No. 2020-151137.

* cited by examiner

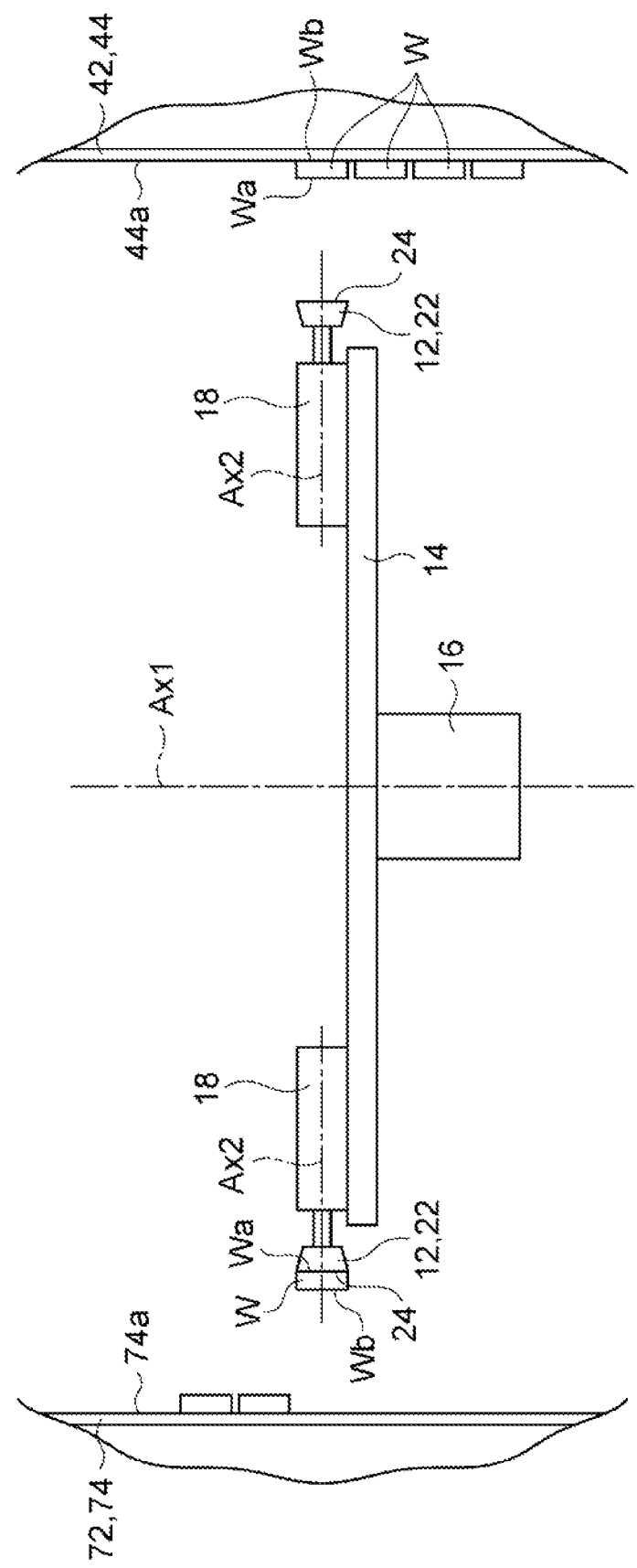

PROCESSING APPARATUS FOR ELECTRONIC COMPONENT

CROSS REFERENCE TO RELATED APPLICATIONS

This application is a National Stage of International Application No. PCT/JP2021/032544 filed on Sep. 3, 2021 claiming priority from Japanese Patent Application No. 2020-151137 filed on Sep. 9, 2020, the disclosures of which are incorporated herein in their entirety by reference.

TECHNICAL FIELD

The present disclosure relates to a processing apparatus for an electronic component.

BACKGROUND ART

Patent Literature 1 discloses a delivery device including a plurality of arms that is disposed on a rotary turret and receive and transfer electronic components. Patent Literature 2 discloses a conveying device including a base member that rotates about a rotation axis, and a plurality of nozzles that are disposed along a circumferential direction with respect to the base member and suction and hold components.

CITATION LIST

Patent Literature

Patent Literature 1: US2018/0037421
Patent Literature 2: JP2016-092391A

SUMMARY OF INVENTION

Technical Problem

The present disclosure relates to a processing apparatus for an electronic component, which is useful for preventing a deviation of a posture of a component holder or an electronic component in a case in which the electronic component is delivered to and from the component holder held toward an outside of a circular track.

Solution to Problem

According to one aspect of the present disclosure, a processing apparatus for an electronic component includes a component holder configured to hold an electronic component, a turning unit configured to hold the component holder toward an outside of a predetermined circular track; a turning drive unit configured to turn the turning unit around a first axis along a central axis of the circular track; and a rotation drive unit provided on the turning unit and configured to rotate the component holder around a second axis along a radial direction of the circular track.

Advantageous Effects of Invention

According to the present disclosure, there is provided a processing apparatus for an electronic component, which is useful for preventing a deviation of a posture of a component holder or an electronic component in a case in which the electronic component is delivered to and from the component holder held toward an outside of a circular track.

BRIEF DESCRIPTION OF DRAWINGS

FIG. 2 is a plan view schematically illustrating the example of the processing apparatus for the electronic component.

DESCRIPTION OF EMBODIMENTS

Various embodiments will be described hereinafter with reference to accompanying drawings. In the description, equivalent elements or elements having equivalent functions will be denoted by the same symbols, and a redundant description thereof will be omitted.

First Embodiment

Figure 1:
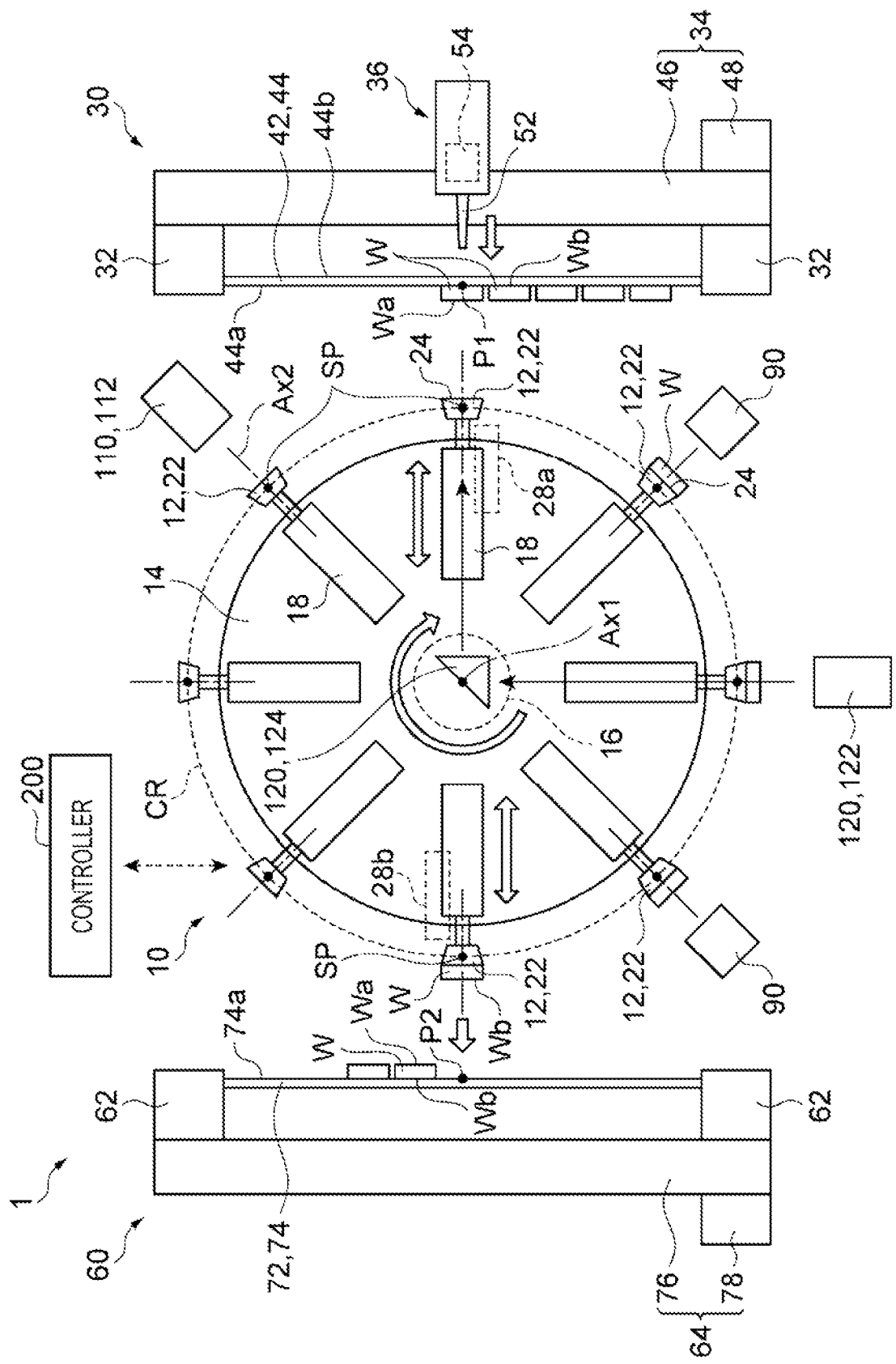
FIG. 1 is a side view schematically illustrating an example of a processing apparatus for an electronic component of a first embodiment.

First, a processing apparatus of an electronic component of a first embodiment will be described with reference to FIGS. 1 to 8. A processing apparatus of an electronic component 1 illustrated in FIG. 1 is a die sorter, and is an apparatus that packages a plurality of electronic components W in a wafer sheet, a tape, a container tube, or the like after performing processes such as visual inspection, electrical characteristic test, marking while sequentially conveying the electronic components W. The plurality of electronic components W to be processed are separated by dicing or the like after being formed in a pre-process of a semiconductor manufacturing process. The processing apparatus 1 includes, for example, a rotary conveyance unit 10, a component supply unit 30, a component collecting unit 60, a plurality of processing units 90, and a controller 200.

The rotary conveyance unit 10 conveys the plurality of electronic components W along a circular track CR around a central axis. The central axis of the circular track CR may be along a horizontal line or a vertical line. In an example illustrated in FIGS. 1 and 2, the rotary conveyance unit 10 conveys the plurality of electronic components W along the circular track CR around the central axis along the horizontal line. Hereinafter, a case in which the central axis of the circular track CR is along the horizontal line will be illustrated. The electronic component W to be conveyed includes main surfaces Wa and Wb parallel to each other (opposite to each other). In one example, the electronic component W is formed in a rectangular parallelepiped shape. The rotary conveyance unit 10 includes, for example, a plurality of component holders 12, a turning unit 14, a turning drive unit 16, and a plurality of rotation drive units 18.

The plurality of component holders 12 are disposed at equal intervals along a circumference centered on the central axis of the circular track CR. Specific examples of a method for holding the electronic component W by the component holder 12 include vacuum suction, electrostatic adsorption (holding using a coulomb force), and gripping. The component holder 12 holds the electronic component W by suctioning one of the main surfaces Wa and Wb of the electronic component W from one side in a direction (radial direction of the circular track CR) perpendicular to the central axis of the circular track CR, for example. In the following description of the embodiment, a case in which the rotary conveyance unit 10 includes, as an example of the component holders 12, suction portions 22 that hold the electronic components W by suction. An operation performed by the suction portion 22, an operation with respect to the suction portion 22, and a state (for example, a position and a posture) of the suction portion 22 correspond to an operation performed by the component holder 12, an operation with respect to the component holder 12, and a state of the component holder 12, respectively.

The suction portion 22 directs toward an outside of the circular track CR. The suction portion 22 suctions the electronic component W positioned outside the circular track CR along the radial direction of the circular track CR. In this case, when viewed from a direction in which the central axis of the circular track CR extends, the electronic component W held by the suction portion 22 is positioned outside the circular track CR. The suction portion 22 suctions one of the main surfaces Wa and Wb (for example, the main surface Wa) from one side in the radial direction of the circular track CR. When the suction portion 22 suctions the main surface Wa, the main surface Wa faces an inside of the circular track CR, and the main surface Wb faces the outside of the circular track CR. The suction portion 22 includes a facing surface 24 that faces the electronic component W when the electronic component W is suctioned.

An internal space for applying a suction force to the electronic component W is formed inside the suction portion 22, and the internal space is open in the facing surface 24 (a suction hole is provided in the facing surface 24). The component holder 12 may include a suction pump (not shown) connected to the internal space of the suction portion 22 via a suction path, and an opening and closing valve that switches a suction state of the suction portion 22. The suction portion 22 is disposed such that the facing surface 24 faces the outside of the circular track CR. More specifically, the suction portion 22 is disposed such that the facing surface 24 faces a direction away from the central axis along the radial direction of the circular track CR. The facing surface 24 may be a surface that is perpendicular to a virtual line which passes through a center of the facing surface 24 and extends along the radial direction of the circular track CR in a plane including the circular track CR.

Figure 3A:
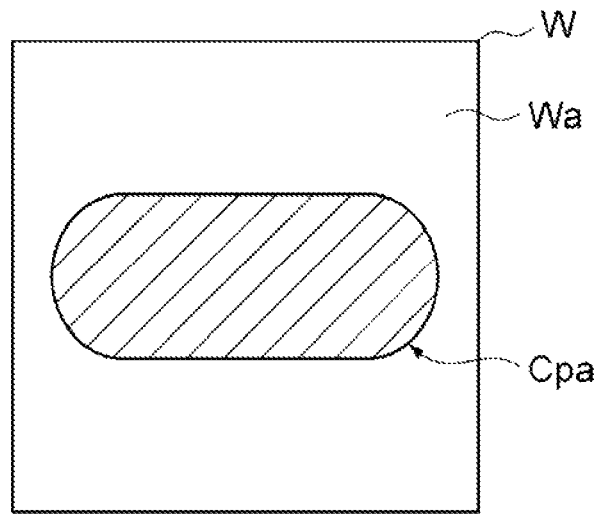
FIG. 3A is a schematic view illustrating an example of a main surface of the electronic component.
Figure 3B:
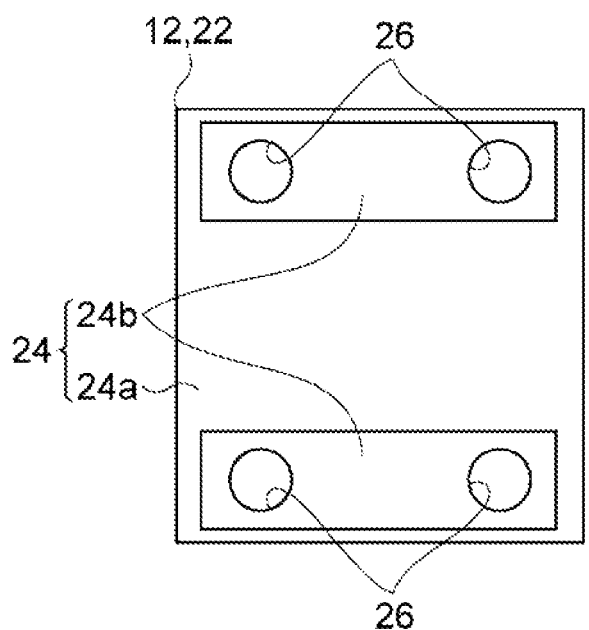
FIG. 3B is a front view schematically illustrating an example of a suction portion.
Figure 3C:
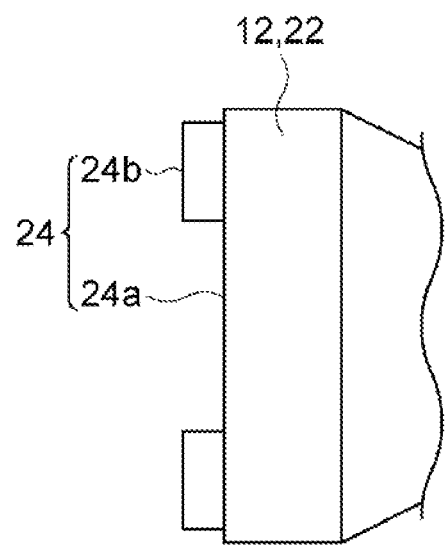
FIG. 3C is a side view schematically illustrating the example of the suction portion.

FIG. 3A to FIG. 3C illustrate an example of the main surface Wa of the electronic component W to be conveyed by the rotary conveyance unit 10 and an example of the suction portion 22. Depending on a type of the electronic component W, a range in which the main surface Wa is allowed to come into contact with the suction portion 22 and a range in which the main surface Wa is not allowed to come into contact with the suction portion 22 (hereinafter, referred to as a "non-contactable range Cpa") are determined in advance. An example of the type of the electronic component W is an optical sensor, and the non-contactable range Cpa is, for example, a light receiving portion of the optical sensor. In the electronic component W illustrated in FIG. 3A, the non-contactable range Cpa is set substantially at a center of the main surface Wa in one width direction (vertical direction of a paper plane).

As illustrated in FIG. 3B, an outer edge of the facing surface 24 of the suction portion 22 may be quadrangular like an outer edge of the main surface Wa of the electronic component W. The facing surface 24 is formed in a manner of being contactable with a region of the main surface Wa other than the non-contactable range Cpa without coming into contact with the non-contactable range Cpa. For example, as illustrated in FIG. 3B and FIG. 3C, the facing surface 24 includes a base end surface 24a and contact surfaces 24b. The contact surface 24b protrudes from the base end surface 24a in a direction away from the central axis of the circular track CR. In this case, a distance between the contact surface 24b and the central axis of the circular track CR is larger than a distance between the base end surface 24a and the central axis of the circular track CR. Therefore, when the suction portion 22 suctions the electronic component W, the base end surface 24a does not come into contact with the main surface Wa, and the contact surface 24b comes into contact with the main surface Wa.

The contact surface 24b of the facing surface 24 is provided in a manner of corresponding to a range in which contact on the main surface Wa of the electronic component W is allowed. For example, in the suction portion 22 illustrated in FIG. 3B, the contact surfaces 24b are provided at both end portions of the facing surface 24 in one width direction (vertical direction of the paper plane). A plurality of (for example, four) suction holes 26 that connect the main surface Wa of the electronic component W and the internal space of the suction portion 22 are opened in the contact surfaces 24b. When viewed from a direction perpendicular to the facing surface 24, opening regions (regions surrounded by opening edges of the suction holes) of the plurality of suction holes 26 and the contact surface 24b may not be circularly symmetrical about a center of the facing surface 24 (rotationally symmetrical about any angle from 0 degrees to 360 degrees). For example, the opening regions of the plurality of suction holes 26 and the contact surfaces 24b have one or two rotational symmetry.

Figure 4A:
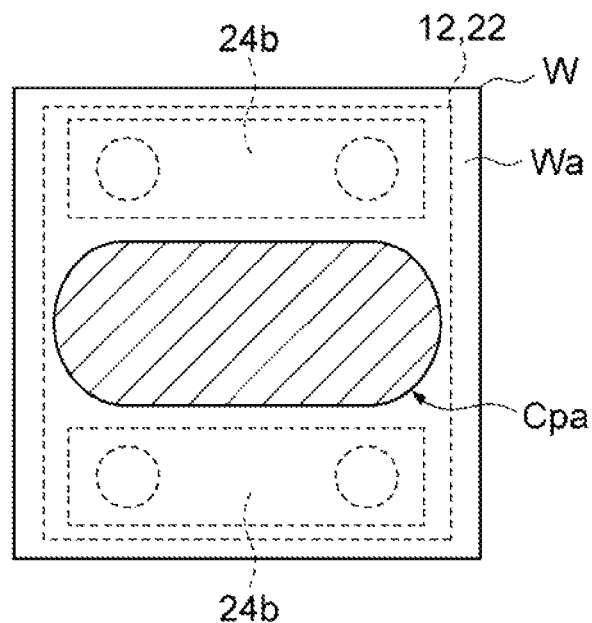
FIG. 4A and FIG. 4B are schematic views illustrating postures of the suction portion with respect to the electronic component.
Figure 4B:
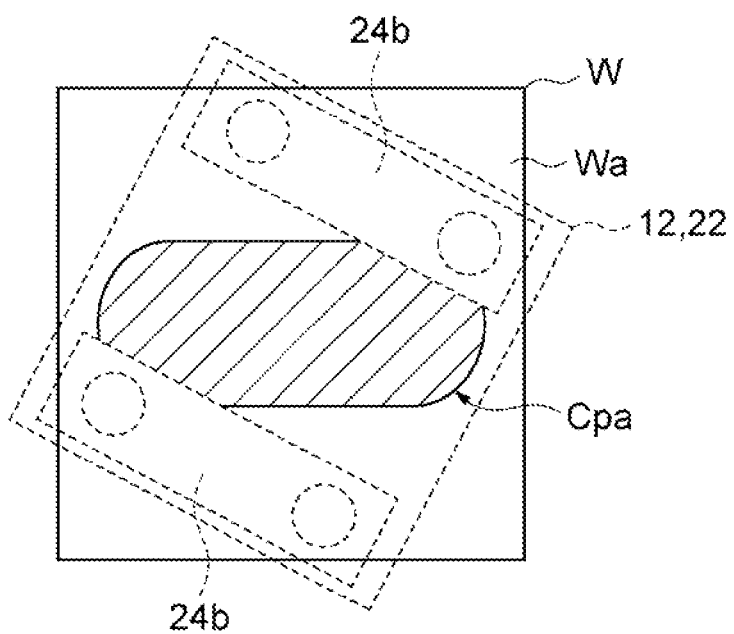

FIG. 4A and FIG. 4B illustrate postures of the suction portion 22 (facing surface 24) with respect to the electronic component W (main surface Wa) when the suction portion 22 suctions the electronic component W. FIG. 4A illustrates an example of a positional relationship between the main surface Wa and the facing surface 24 in a case in which suction is performed in a state in which the posture of the suction portion 22 with respect to the electronic component W (hereinafter, simply referred to as "the posture of the suction portion 22") is ideal. FIG. 4B illustrates an example of the positional relationship between the main surface Wa and the facing surface 24 when the suction is performed in a state (state in which the suction portion 22 is inclined) in which the posture of the suction portion 22 is deviated from an ideal state. When the posture of the suction portion 22 is in the ideal state, the contact surface 24b of the facing surface 24 comes into contact with a region of the main surface Wa other than the non-contactable range Cpa. On the other hand, when the posture of the suction portion 22 is deviated from the ideal state, the contact surface 24b of the facing surface 24 may come into contact with the non-contactable range Cpa. In the case in which the electronic component W and the suction portion 22 described above are used, when the suction portion 22 receives the electronic component W, in order to avoid contact between the non-contactable range Cpa and the suction portion 22, it is necessary to perform the suction by bringing the posture of the suction portion 22 close to the ideal state.

Returning to FIG. 1 or 2, the turning unit 14 of the rotary conveyance unit 10 is a member that holds the plurality of component holders 12 (the plurality of suction portions 22). The turning unit 14 holds the plurality of component holders 12 (the plurality of suction portions 22) such that the component holders 12 are positioned on the circular track CR. The turning unit 14 holds each of the suction portions 22 toward the outside of the circular track CR. More specifically, the turning unit 14 holds each of the suction portions 22 such that the facing surface 24 faces the outside of the circular track CR. The turning unit 14 is provided in a manner of being rotatable around an axis Ax1 (first axis) along the central axis of the circular track CR.

The turning drive unit 16 allows the turning unit 14 to turn (rotate) around the axis Ax1. For example, the turning drive unit 16 includes a power source such as an electric motor, and allows the turning unit 14 to turn around the axis Ax1 by a direct drive without a gear. Accordingly, the plurality of component holders 12 (the plurality of suction portions 22) move along the circular track CR centered on the central axis along the axis Ax1. The turning drive unit 16 may repeat turning and stopping of the turning unit 14 at the same pitch as an angular pitch (angular pitch around the axis Ax1) between the suction portions 22 adjacent to each other on the circular track CR. Hereinafter, a plurality of positions at which the plurality of suction portions 22 are disposed when the turning drive unit 16 stops the turning unit 14 are referred to as "a plurality of stop positions SP".

The plurality of rotation drive units 18 are provided on the turning unit 14 in a manner of corresponding to the plurality of component holders 12 (the plurality of suction portions 22), respectively. Each of the rotation drive units 18 rotates the suction portion 22 around an axis Ax2 (second axis) along the radial direction of the circular track CR so as to adjust the posture (inclination) of the corresponding suction portion 22. The rotation drive unit 18 is a rotation actuator that rotates the suction portion 22 around the axis Ax2 by a power source such as an electric motor. The axis Ax2 of each of the plurality of turning drive units 18 moves around the axis Ax1 in accordance with the turning of the turning unit 14 by the turning drive unit 16. The axis Ax2 may be set in a manner of passing through the axis Ax1 and the center of the facing surface 24 of the suction portion 22 along a plane including the circular track CR regardless of the stop position SP of the corresponding suction portion 22.

The component supply unit 30 sequentially supplies the plurality of electronic components W to the rotary conveyance unit 10 at any one of the plurality of stop positions SP. Hereinafter, the stop position SP at which the electronic component W is supplied is referred to as a "stop position SP for supply". In the supply of the electronic component W from the component supply unit 30 to the rotary conveyance unit 10, the electronic component W is delivered to the suction portion 22 disposed at the stop position SP for supply. The stop position SP for supply is set to, for example, a stop position SP located at one end in a horizontal direction among the plurality of stop positions SP. In this case, the facing surface 24 of the suction portion 22 disposed at the stop position SP for supply is in a vertically standing state. The component supply unit 30 includes, for example, container holders 32 and a container position adjuster 34 (position adjuster).

The container holders 32 hold a container 42 that stores the plurality of electronic components W to be supplied to the suction portion 22. The container 42 stores, for example, a plurality of electronic components W to be supplied to the suction portion 22 disposed at the stop position SP for supply. The container holders 32 hold the container 42 in a manner of facing the suction portion 22 in a state of being disposed at the stop position SP for supply. The container 42 may store the plurality of electronic components W in a two-dimensional arrangement along a plane (plane perpendicular to the axis Ax2 passing through the stop position SP for supply) parallel to the facing surface 24 of the suction portion 22 positioned at the stop position SP for supply. For example, the plurality of electronic components W stored on the container 42 are arranged in a horizontal direction and a vertical direction. An example of the container 42 is a wafer sheet 44 illustrated in FIGS. 1 and 2.

The wafer sheet 44 includes an adhesive attachment surface 44a to which a semiconductor wafer is attached. The semiconductor wafer is attached to the attachment surface 44a in a state of being cut into a plurality of electronic components W (for example, optical sensors) by dicing. One of the main surfaces Wa and Wb (for example, the main surface Wb) of the electronic component W is attached to the attachment surface 44a. A ring frame (not shown) may be attached to a peripheral portion of the wafer sheet 44, and the container holders 32 (sheet holder) may hold the ring frame. The container holders 32 hold the wafer sheet 44 around the circular track CR such that the attachment surface 44a faces (is parallel to) the facing surface 24 of the suction portion 22 disposed at the stop position SP for supply in a vertically standing state.

The container position adjuster 34 adjusts a position of the container holder 32 along a plane intersecting with a direction (radial direction of the circular track CR) in which the container 42 (for example, the wafer sheet 44) and the suction portion 22 face each other. For example, the container position adjuster 34 changes the position of the container holder 32 along a plane perpendicular to a direction in which the container 42 and the facing surface 24 of the suction portion 22 positioned at the stop position SP for supply face each other. When the position of the container holder 32 is changed, a position of the container 42 held by the container holders 32 is changed. As a result, positions of the plurality of electronic components W on the container 42 are changed.

The container position adjuster 34 moves the container holder 32 such that the plurality of electronic components W on the container 42 are sequentially disposed at a position (hereinafter, referred to as a "receiving position P1") at which the suction portion 22 disposed at the stop position SP for supply receives one electronic component W. The receiving position P1 is set, for example, at an intersection of the container 42 and a virtual line passing through the axis Ax1 and the stop position SP for supply in the plane including the circular track CR. In order to sequentially dispose the plurality of electronic components W at the receiving position P1, the container position adjuster 34 may sequentially move (may intermittently move) the container holder 32 by an interval (pitch) between centers of the adjacent electronic components W stored on the container 42.

When the container 42 is the wafer sheet 44, the container position adjuster 34 may change the position of the container holder 32 in two directions along the attachment surface 44a. In one example, the container position adjuster 34 includes a first drive portion 46 and a second drive portion 48. The first drive portion 46 moves the container holder 32 (wafer sheet 44) in the vertical direction along the attachment surface 44a by a power source such as an electric motor. The second drive portion 48 moves the container holder 32 (wafer sheet 44) in the horizontal direction along the attachment surface 44a by a power source such as an electric motor.

When the container 42 is the wafer sheet 44, the component supply unit 30 may further include a pushing portion 36. The pushing portion 36 is disposed such that the wafer sheet 44 (electronic component W to be supplied) is sandwiched between the pushing portion 36 and the stop position SP for supply. The pushing portion 36 pushes a region of the wafer sheet 44 corresponding to the receiving position P1 so as to approach the stop position SP for supply. The pushing portion 36 includes, for example, a pushing pin 52 and a pushing drive portion 54.

The pushing pin 52 protrudes toward a back surface 44b (surface opposite to the attachment surface 44a) of the wafer sheet 44, and are disposed in a manner of corresponding to the receiving position P1. The pushing pin 52 extends along a line perpendicular to the attachment surface 44a and the back surface 44b. The pushing drive portion 54 allows the pushing pin 52 to advance or retract along the line perpendicular to the attachment surface 44a and the back surface 44b by the power source such as an electric motor.

The component collecting unit 60 collects the electronic component W from the rotary conveyance unit 10 at any one of the plurality of stop positions SP. Hereinafter, the stop position SP at which the electronic component W is collected is referred to as a "stop position SP for collecting". In the collecting of the electronic component W from the rotary conveyance unit 10 to the component collecting unit 60, the electronic component W is transferred from the suction portion 22 disposed at the stop position SP for collecting to the component collecting unit 60. The stop position SP for collecting is, for example, located at one end portion in the horizontal direction among the plurality of stop positions SP, and is separated from the stop position SP for supply by 180° in a circumferential direction. In this case, the facing surface 24 of the suction portion 22 disposed at the stop position SP for collecting is in a vertically standing state. The component collecting unit 60 includes, for example, container holders 62 and a container position adjuster 64 (second position adjuster).

The container holders 62 hold a container 72 that stores the plurality of electronic components W collected from the suction portion 22. The container 72 stores the plurality of electronic components W that have been sequentially collected from the suction portion 22 disposed at the stop position SP for collecting. The container holders 62 holds the container 72 such that the container 72 faces the suction portion 22 that is disposed at the stop position SP for collecting. The container 72 may store the plurality of electronic components W in a two-dimensional arrangement along a plane (plane perpendicular to the axis Ax2 passing through the stop position SP for collecting) parallel to the facing surface 24 of the suction portion 22 positioned at the stop position SP for collecting. For example, the plurality of electronic components W are stored on the container 72 in a state of being arranged in a horizontal direction and a vertical direction. An example of the container 72 is a wafer sheet 74 illustrated in FIGS. 1 and 2.

The wafer sheet 74 includes an adhesive attachment surface 74a to which the plurality of electronic components W are attached. For example, the main surface Wb of the electronic component W is attached to the attachment surface 74a. A ring frame (not shown) may be attached to a peripheral portion of the wafer sheet 74, and the container holders 62 (sheet holder) may hold the ring frame. The container holders 62 hold the wafer sheet 74 around the circular track CR such that the attachment surface 74a faces (is parallel to the facing surface 24) the facing surface 24 of the suction portion 22 disposed at the stop position SP for collecting in a vertically standing state.

The container position adjuster 64 adjusts a position of the container holders 62 along a plane intersecting with a direction (radial direction of the circular track CR) in which the container 72 (for example, the wafer sheet 74) and the suction portion 22 face each other. For example, the container position adjuster 64 changes a position of the container holders 62 along a plane perpendicular to a direction in which the container 72 and the facing surface 24 of the suction portion 22 positioned at the stop position SP for collecting face each other. When the position of the container holders 62 is changed, a position of the container 72 held by the container holders 62 is changed. As a result, the positions of the plurality of electronic components W on the container 72 (or a region where the electronic component W is to be stored on the container 72) are changed.

The container position adjuster 64 moves the container holder 62 such that the region where the electronic component W is to be stored on the container 72 (hereinafter, referred to as a "planned storage region") is sequentially disposed at a position (hereinafter, referred to as a "transfer position P2") where the suction portion 22 disposed at the stop position SP for collecting transfers one electronic component W. The transfer position P2 is set, for example, at an intersection of the container 72 and a virtual line passing through the axis Ax1 and the stop position SP for collecting on the plane including the circular track CR. The container position adjuster 64 may sequentially move (may intermittently move) the container holder 62 such that the centers of the adjacent electronic components W are equally spaced (at the same pitch) when the electronic components W are stored on the container 72.

In a case in which the container 72 is the wafer sheet 74, the container position adjuster 64 may change the position of the container holder 62 in two directions along the attachment surface 74a. In one example, the container position adjuster 64 includes a first drive portion 76 and a second drive portion 78. The first drive portion 76 moves the container holder 62 (wafer sheet 74) in the vertical direction along the attachment surface 74a by a power source such as an electric motor. The second drive portion 78 moves the container holder 62 (wafer sheet 74) in the horizontal direction along the attachment surface 74a by a power source such as an electric motor. In the following description of the first embodiment, a case is illustrated in which the container 42 held by the container holders 32 in the component supply unit 30 is the wafer sheet 44, and the container 72 held by the container holders 62 in the component collecting unit 60 is the wafer sheet 74.

The rotary conveyance unit 10 may further include one or a plurality of advance and retract driving portions that move the suction portion 22 of the component holder 12 along the radial direction of circular track CR. For example, the rotary conveyance unit 10 includes an advance and retract driving portion 28a that allows the suction portion 22 disposed at the stop position SP for supply to advance and retract along the radial direction of the circular track CR, and an advance and retract driving portion 28b that allows the suction portion 22 disposed at the stop position SP for collecting to advance and retract along the radial direction of the circular track CR.

The advance and retract driving portion 28a moves both the suction portion 22 disposed at the stop position SP for supply and the rotation drive unit 18 that rotates the suction portion 22 around the axis Ax2 along the radial direction of the circular track CR (moves the suction portions 22 and the rotation drive unit 18 with respect to the turning unit 14). The suction portion 22 and the corresponding rotation drive unit 18 may provided on the turning unit 14 in a manner of being movable along the radial direction of the circular track CR. The advance and retract driving portion 28a may be provided in a manner of not moving in accordance with the turning of the turning unit 14 by the turning drive unit 16. When the suction portion 22 advances along the radial direction of the circular track CR by the advance and retract driving portion 28a, the suction portion 22 moves in a direction away from the axis Ax1 with a position on the circular track CR as a starting point.

The advance and retract driving portion 28a allows the suction portion 22 and the corresponding rotation drive unit 18 to advance from the axis Ax1 toward the outside of the circular track CR, and allows the suction portion 22 and the rotation drive unit 18 to retract from the outside of the circular track CR toward the axis Ax1. In one example, the suction portion 22 receives the electronic component W from the component supply unit 30 in a state in which the suction portion 22 advances to an outside of the stop position SP for supply with respect to the axis Ax1 by the advance and retract driving portion 28a. The advance and retract driving portion 28b is configured in the same manner as the advance and retract driving portion 28a except that the suction portion 22 disposed at the stop position SP for collecting and the rotation drive unit 18 corresponding to the suction portion 22 are driving targets. In one example, the suction portion 22 transfers the electronic component W to the component collecting unit 60 in a state in which the suction portion 22 advances to an outside of the stop position SP for collecting with respect to the axis Ax1 by the advance and retract driving portion 28b.

When the advance and retract driving portions 28a and 28b allow the suction portion 22 and the rotation drive unit 18 which are the driving targets to advance, the advance and retract driving portions 28a and 28b may decrease moving speeds of the component holder 12 and the rotation drive unit 18 after the suction portion 22 reaches a predetermined intermediate position. The advance and retract driving portions 28a and 28b may include a load adjusting portion (for example, a voice coil motor) that reduces (adjusts) a load applied to the electronic component W to be delivered when the electronic component W is delivered between the suction portion 22 to be driven and an container such as a wafer sheet.

The processing apparatus 1 may further include a plurality of processing units 90. The plurality of processing units 90 perform predetermined processing on the electronic component W held by the suction portion 22 at any one stop position SP on a part of a path (hereinafter, referred to as a "conveyance path") of the circular track CR along which the electronic component W is conveyed in an order of the stop position SP for supply, the lowermost stop position SP, and the stop position SP for collecting. Specific examples of the processing include electrical characteristic test, visual inspection, and marking (for example, laser marking).

The processing apparatus 1 may further include a posture detection unit 110 and a storage state detection unit 120. The posture detection unit 110 detects an inclination of the suction portion 22 around the axis Ax2 as the posture of the suction portion 22. Specifically, the posture detection unit 110 detects the inclination around the axis Ax2 with respect to the ideal state of the suction portion 22 disposed at any one stop position SP positioned in a path (path other than the above-described conveyance path) of the circular track CR in which the electronic component W is not conveyed. Hereinafter, the stop position SP at which the suction portion 22 to be detected by the posture detection unit 110 is disposed is referred to as a "stop position SP for detection". In the example shown in FIG. 1, the stop position SP for detection is set to a stop position separated from the stop position SP for supply by one angular pitch in a direction opposite to a turning direction of the turning unit 14. The posture detection unit 110 includes, for example, a camera 112.

The camera 112 is disposed in a manner of imaging the suction portion 22 disposed at the stop position SP for detection. For example, the camera 112 is disposed outside the circular track CR such that the entire facing surface 24 of the suction portion 22 can be imaged. The camera 112 includes an imaging element such as a charge coupled device (CCD) image sensor or a complementary metal oxide semiconductor (CMOS) image sensor, and a lens that forms an image on the imaging element.

The storage state detection unit 120 detects a storage state of the electronic component W attached to the wafer sheet 44 (electronic component W stored on the container 42). For example, the storage state detection unit 120 detects a posture of the electronic component W disposed at the receiving position P1 and a position of the electronic component W. The storage state detection unit 120 may detect, as the posture of the electronic component W at the receiving position P1, an inclination of the electronic component W with respect to the ideal state at the receiving position P1. The storage state detection unit 120 may detect, as the position of the electronic component W at the receiving position P1, a position of the electronic component W with respect to an ideal position at the receiving position P1. The storage state detection unit 120 includes, for example, a camera 122 and a mirror member 124.

The camera 122 images the main surface Wa of the electronic component W at the receiving position P1 from the inside of the circular track CR. The camera 122 is disposed, for example, below the rotary conveyance unit 10 and outside the circular track CR. The camera 122 includes an imaging element such as a CCD image sensor or a CMOS image sensor, and a lens that forms an image on the imaging element.

The mirror member 124 is disposed in a manner of providing a viewpoint for imaging the main surface Wa of the electronic component W at the receiving position P1 inside the circular track CR. The mirror member 124 is disposed at a center of the circular track CR, and reflects light introduced into the mirror member 124 from the receiving position P1 toward the camera 122. The mirror member 124 may be configured in any manner as long as the mirror member 124 includes a reflective surface that reflects the light toward the camera 122. For example, the mirror member 124 may be a plate-shaped mirror, or may be a prism configured and disposed such that one surface thereof serves as the reflective surface. The camera 112 may image the main surface Wa of the electronic component W at the receiving position P1 via the mirror member 124 in a state (timing) in which none of the members are disposed on the optical paths reaching the receiving position P1, the mirror member 124, and the camera 122.

Figure 5:
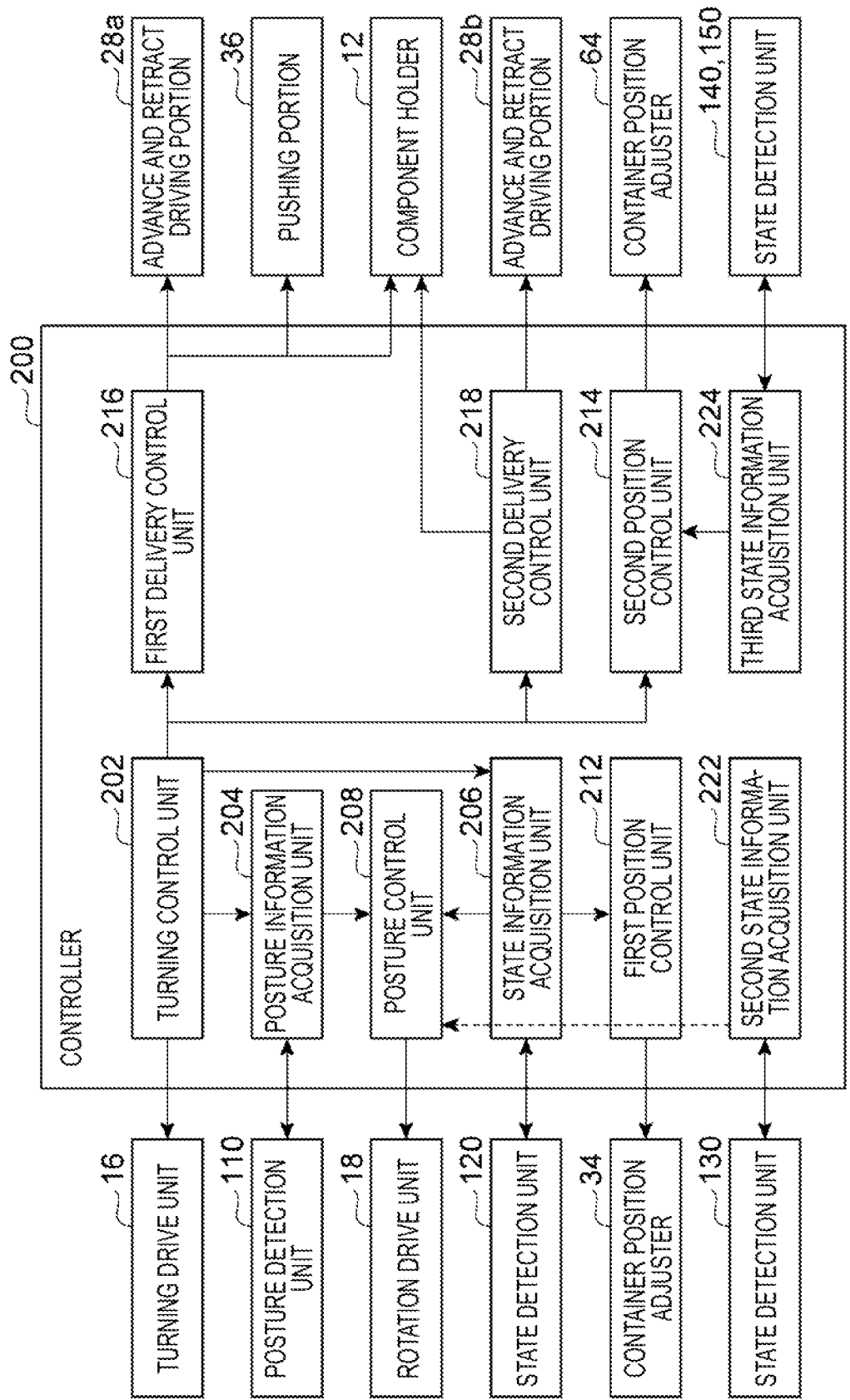
FIG. 5 is a block diagram illustrating an example of a functional configuration of a controller.

The controller 200 controls each of the members of the processing apparatus 1. For example, as illustrated in FIG. 5, the controller 200 includes a turning control unit 202, a posture information acquisition unit 204, a state information acquisition unit 206, a posture control unit 208, a first position control unit 212, a second position control unit 214, a first delivery control unit 216, and a second delivery control unit 218 as functional configurations (hereinafter, referred to as "functional modules"). The processing executed by each of the functional modules corresponds to processing executed by the controller 200. Hereinafter, each of the functional modules will be described.

The turning control unit 202 causes the turning drive unit 16 to intermittently turn the turning unit 14 such that the plurality of suction portions 22 are sequentially disposed at the plurality of stop positions SP, respectively. In the present disclosure, the intermittently turning means repeating rotation and stop. For example, the turning control unit 202 causes the turning drive unit 16 to intermittently turn the turning unit 14 at the same pitch as the angular pitch between the suction portions 22 adjacent to each other on the circular track CR. Accordingly, the plurality of suction portions 22 are sequentially disposed at the stop positions SP, respectively. In one example, the turning control unit 202 controls the turning drive unit 16 such that each of the plurality of suction portions 22 turns in a direction passing through the stop position SP for supply, the lowermost stop position SP, the stop position SP for collecting, and the uppermost stop position SP in order (clockwise direction in FIG. 1).

The posture information acquisition unit 204 detects, by the posture detection unit 110, information indicating the posture (inclination around the axis Ax2) of the suction portion 22 that does not hold the electronic component W. For example, the posture information acquisition unit 204 causes the camera 112 of the posture detection unit 110 to acquire an image of the facing surface 24 of the suction portion 22 in a state in which any one of the plurality of suction portions 22 is disposed at the stop position SP for detection.

The state information acquisition unit 206 detects, by the storage state detection unit 120, information indicating the storage state of the electronic component W stored on the wafer sheet 44. The state information acquisition unit 206 detects, by the storage state detection unit 120, for example, information indicating the storage state of the electronic component W disposed at the receiving position P1 on the wafer sheet 44. The state information acquisition unit 206 may acquire, by the storage state detection unit 120, at least one of the information indicating the inclination of the electronic component W and the information indicating the position of the electronic component W as the information indicating the storage state of the electronic component W at the receiving position P1. In one example, the state information acquisition unit 206 causes the camera 122 of the storage state detection unit 120 to obtain an image of the main surface Wa of the electronic component W disposed at the receiving position P1.

The posture control unit 208 controls the corresponding rotation drive unit 18 so as to adjust the inclination of the suction portion 22 in accordance with a detection result of the inclination around the axis Ax2 of the suction portion 22 that does not hold the electronic component W. More specifically, before the suction portion 22 to be adjusted receives the electronic component W from the wafer sheet 44, the posture control unit 208 controls the corresponding rotation drive units 18 such that the inclination of the suction portion 22 approaches zero (the posture of the suction portion 22 approaches the ideal state). The posture control unit 208 may adjust the inclination of the suction portion 22 by the corresponding rotation drive unit 18 according to the inclination of the electronic component W on the wafer sheet 44 to be received by the suction portion 22 in addition to the inclination of the suction portion 22 around the axis Ax2. In this case, the posture control unit 208 may cause the corresponding rotation drive unit 18 to rotate the suction portion 22 around the axis Ax2 by a rotation amount obtained by adding a component corresponding to the inclination of the suction portion 22 and a component corresponding to the inclination of the electronic component W such that the inclination of the suction portion 22 with respect to the electronic component W to be received approaches zero.

The first position control unit 212 controls the container position adjuster 34 to dispose the electronic component W to be supplied on the wafer sheet 44 at the receiving position P1 each time any one of the suction portions 22 is disposed at the stop position SP for supply. Further, the first position control unit 212 controls the container position adjuster 34 to adjust the position of the electronic component W according to the position (for example, the position of the electronic component W at the receiving position P1) of the electronic component W on the wafer sheet 44 acquired by the state information acquisition unit 206. For example, the first position control unit 212 controls the container position adjuster 34 such that the position of the electronic component W at the receiving position P1 approaches the ideal position.

The second position control unit 214 controls the container position adjuster 64 to dispose the region of the wafer sheet 74 where the electronic component W is to be stored after being collected (planned storage region) at the transfer position P2 each time any one of the suction portions 22 is disposed at the stop position SP for collecting.

The first delivery control unit 216 controls the rotary conveyance unit 10 and the component supply unit 30 such that the suction portion 22 receives the electronic component W to be supplied, each time any one of the suction portions 22 is disposed at the stop position SP for supply. For example, the first delivery control unit 216 causes the advance and retract driving portion 28a to advance the suction portion 22 disposed at the stop position SP for supply to the outside of the circular track CR (move the suction portion 22 until the suction portion 22 comes into contact with the main surface Wa of the electronic component W on the wafer sheet 44). Further, the first delivery control unit 216 causes the suction portion 22 to suction the electronic component W at the receiving position P1. Thereafter, the first delivery control unit 216 causes the pushing drive portion 54 to advance the pushing pin 52 such that the electronic component W at the receiving position P1 is pushed out in a direction approaching the suction portion 22 while causing the advance and retract driving portion 28a to retract the suction portion 22.

The second delivery control unit 218 controls the rotary conveyance unit 10 and the component collecting unit 60 such that the suction portion 22 transfers the electronic component W to the wafer sheet 74, each time any one of the suction portions 22 is disposed at the stop position SP for collecting. For example, the second delivery control unit 218 causes the advance and retract driving portion 28b to advance the suction portion 22 disposed at the stop position SP for collecting to the outside of the circular track CR until the electronic component W (main surface Wb) held by the suction portion 22 comes into contact with the wafer sheet 74. Further, after the electronic component W held by the suction portion 22 comes into contact with the wafer sheet 74, the second delivery control unit 218 causes the suction portion 22 to release the suction of the electronic component W.

Figure 6:
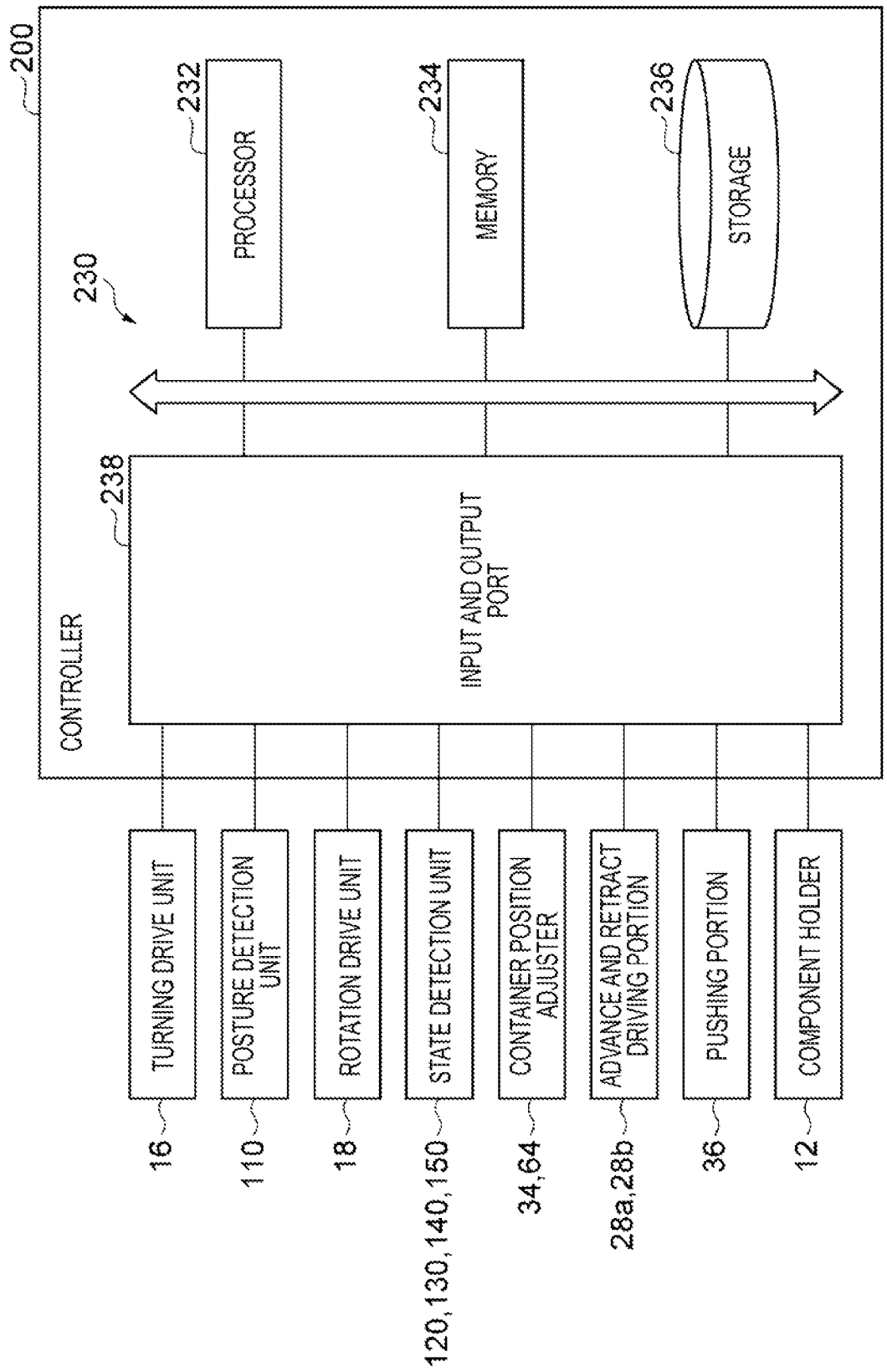
FIG. 6 is a block diagram illustrating an example of a hardware configuration of the controller.

FIG. 6 is a block diagram illustrating a hardware configuration of the controller 200. As illustrated in FIG. 6, the controller 200 includes a circuit 230. The circuit 230 includes one or more processors 232, a memory 234, storage 236, and an input and output port 238. The storage 236 includes a computer-readable storage medium such as a nonvolatile semiconductor memory. The storage 236 stores a program that causes the controller 200 to execute control of the rotary conveyance unit 10, the component supply unit 30, the component collecting unit 60, the processing units 90, the posture detection unit 110, and the storage state detection unit 120 according to a preset control procedure. For example, the storage 236 stores a program that configures each of the above-described functional modules.

The memory 234 temporarily stores the program loaded from the storage medium of the storage 236 and a calculation result calculated by the processor 232. The processor 232 configures each of the functional modules of the controller 200 by executing the program in cooperation with the memory 234. The input and output port 238 inputs and outputs an electric signal to and from the component holder 12, the turning drive unit 16, the rotation drive units 18, the container position adjusters 34 and 64, the advance and retract driving portions 28a and 28b, the pushing portion 36, the posture detection unit 110, the storage state detection unit 120, and the like in accordance with a command from the processor 232. The circuit 230 is not necessarily limited to a configuration in which each function is configured by the program. For example, at least a part of the functions of the circuit 230 may be configured by a dedicated logic circuit or an application specific integrated circuit (ASIC) in which the dedicated logic circuit is integrated.

[Method for Processing Electronic Component]

Next, as an example of a method for processing an electronic component (control procedure executed by the controller 200), a series of processes until the suction portion 22 receives the electronic component W will be described.

Figure 7:
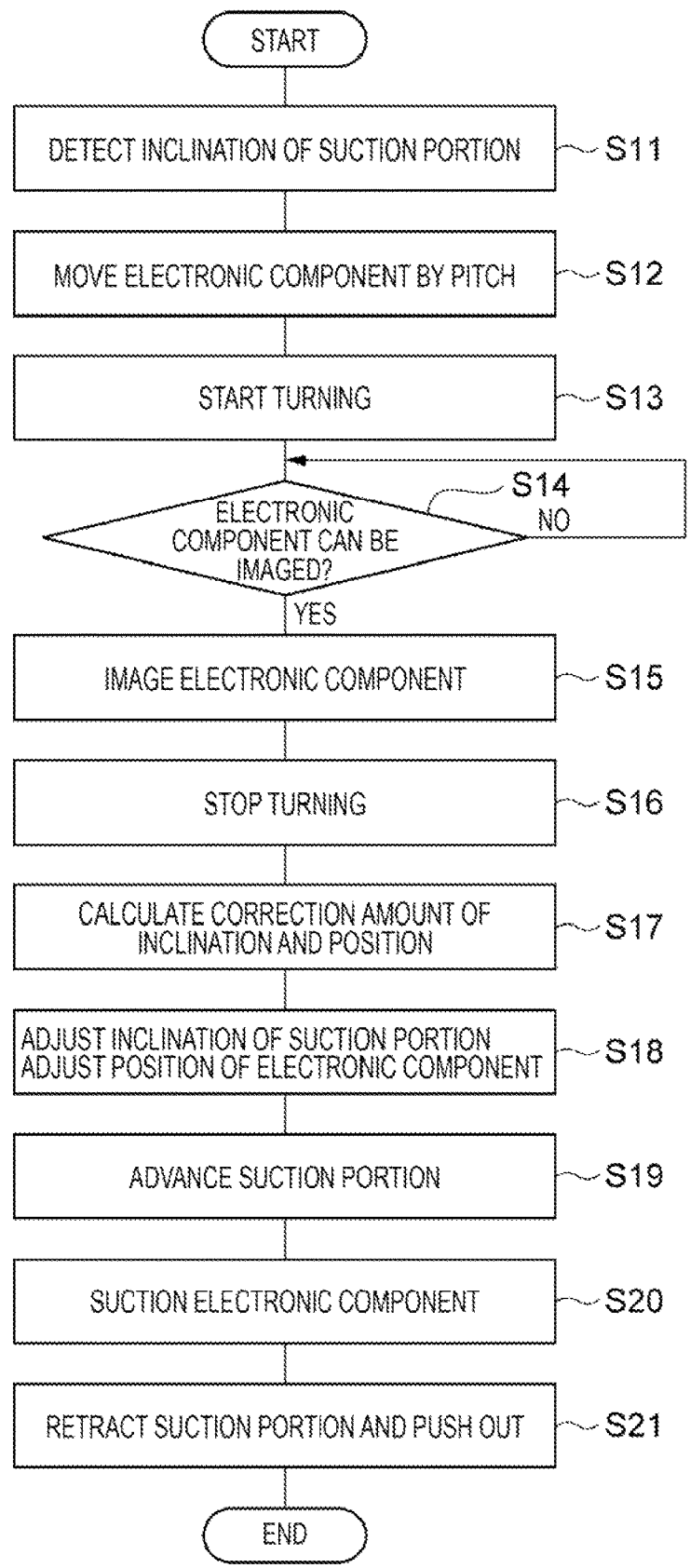
FIG. 7 is a flowchart illustrating an example of a series of processes until the suction portion receives the electronic component.

FIG. 7 is a flowchart illustrating an example of a series of processes until one suction portion 22 receives the electronic component W.

The controller 200 sequentially executes steps S11 and S12 in a state in which the suction portion 22 that does not hold the electronic component W is disposed at the stop position SP for detection. In step S11, for example, the posture information acquisition unit 204 causes the camera 112 of the posture detection unit 110 to acquire the image of the facing surface 24 of the suction portion 22 disposed at the stop position SP for detection. In step S12, for example, the first position control unit 212 controls the container position adjuster 34 such that the container holder 32 (wafer sheet 44) moves by one pitch of the interval (pitch) between the centers of the electronic components W on the container 72 in order to dispose the electronic component W to be supplied on the wafer sheet 44 at the receiving position P1.

Next, the controller 200 sequentially executes steps S13 and S14. In step S13, for example, the turning control unit 202 causes the turning drive unit 16 to start intermittent turning of the turning unit 14 by one angular pitch on the circular track CR. In step S14, for example, the state information acquisition unit 206 waits until imaging of the electronic component W at the receiving position P1 becomes possible. In one example, the state information acquisition unit 206 waits until a timing at which none of the members are positioned on an optical path between the receiving position P1 and the mirror member 124 of the storage state detection unit 120. The timing is stored in advance in the controller 200, for example.

Next, the controller 200 sequentially executes steps S15 and S16. In step S15, for example, the state information acquisition unit 206 causes the camera 122 of the storage state detection unit 120 to acquire the image of the main surface Wa of the electronic component W at the receiving position P1. In step S16, for example, the turning control unit 202 causes the turning drive unit 16 to stop the turning of the turning unit 14 by the one angular pitch on the circular track CR. Through the processing up to step S16, the suction portion 22 that receives the electronic component W to be supplied is disposed at the stop position SP for supply.

Next, the controller 200 executes step S17. In step S17, for example, the posture control unit 208 calculates a correction amount of the inclination of the suction portion 22 according to the inclination of the suction portion 22 detected based on the image obtained in step S11 and the inclination of the electronic component W at the receiving position P1 detected based on the image obtained in step S15. The posture control unit 208 calculates the correction amount of the inclination of the suction portion 22 such that the deviation of the inclination between the suction portions 22 and the electronic components W approaches zero (such that the posture of the suction portion 22 with respect to the electronic component W approaches the ideal state).

In step S17, the first position control unit 212 calculates the correction amount of the position of the electronic component W on the wafer sheet 44 according to the position of the electronic component W at the receiving position P1 detected based on the image obtained in step S15 such that the deviation of the position between the suction portion 22 and the electronic component W approaches zero (such that the position of the suction portion 22 with respect to the electronic component W approaches the ideal state). In one example, the first position control unit 212 calculates the correction amount of the position of the electronic component W such that a center of the suction portion 22 and a center of the electronic component W at the receiving position P1 substantially coincide with each other.

Next, the controller 200 executes step S18. In step S18, for example, the posture control unit 208 controls the corresponding rotation drive units 18 so as to rotate the suction portion 22 by the correction amount (rotation amount according to the correction amount) of the inclination calculated in step S17. The first position control unit 212 controls the container position adjuster 34 to move the container holder 32 (wafer sheet 44) by the correction amount (movement amount according to the correction amount) of the position calculated in step S17.

Next, the controller 200 sequentially executes steps S19, S20, and S21. For example, in step S19, the first delivery control unit 216 causes the advance and retract driving portion 28a to move the suction portion 22 disposed at the stop position SP for supply in a direction approaching the wafer sheet 44 until the suction portion 22 comes into contact with the main surface Wa of the electronic component W at the receiving position P1. In step S20, for example, the first delivery control unit 216 causes the suction portion 22 to suction the main surface Wa of the electronic component W. In step S21, for example, the first delivery control unit 216 causes the advance and retract driving portion 28a to retract the advanced suction portion 22, and causes the pushing drive portion 54 to advance the pushing pin 52 such that the electronic component W at the receiving position P1 is pushed out in the direction approaching the suction portion 22. Accordingly, the electronic component W at the receiving position P1 is separated from the wafer sheet 44, and the suction portion 22 receives the electronic component W.

The controller 200 may also execute the series of processes of steps S11 to S21 for the other suction portions 22 (other electronic components W). Accordingly, the plurality of suction portions 22 sequentially receive any one of the plurality of electronic components W on the wafer sheet 44. The controller 200 may start the series of processes of steps S11 to S21 for the other suction portions 22 (suction portions 22 that receive the subsequent electronic components W) from the middle of the series of processes of steps S11 to S21 for one suction portions 22 (for example, after execution of step S16).

The series of processes described above is an example, and can be appropriately changed. In the series of processes described above, the controller 200 may execute one step and the next step in parallel, or may execute each step in an order different from that of the above-described example. The controller 200 may omit any one of the steps, and may execute a process different from the above-described example in any one of the steps.

In step S17, the controller 200 may calculate the correction amount of the inclination of the suction portion 22 without calculating the correction amount of the position of the electronic component W at the receiving position P1. In this case, in step S18, the controller 200 may adjust the inclination of the suction portion 22 by the corresponding rotation drive unit 18 without causing the container position adjuster 34 to adjust the position of the electronic component W at the receiving position P1. As described above, the inclination of the suction portion 22 may be adjusted without detecting the storage state (posture and position) of the electronic component W at the receiving position P1 on the wafer sheet 44. In this case, the processing apparatus 1 may not include the storage state detection unit 120.

Figure 8:
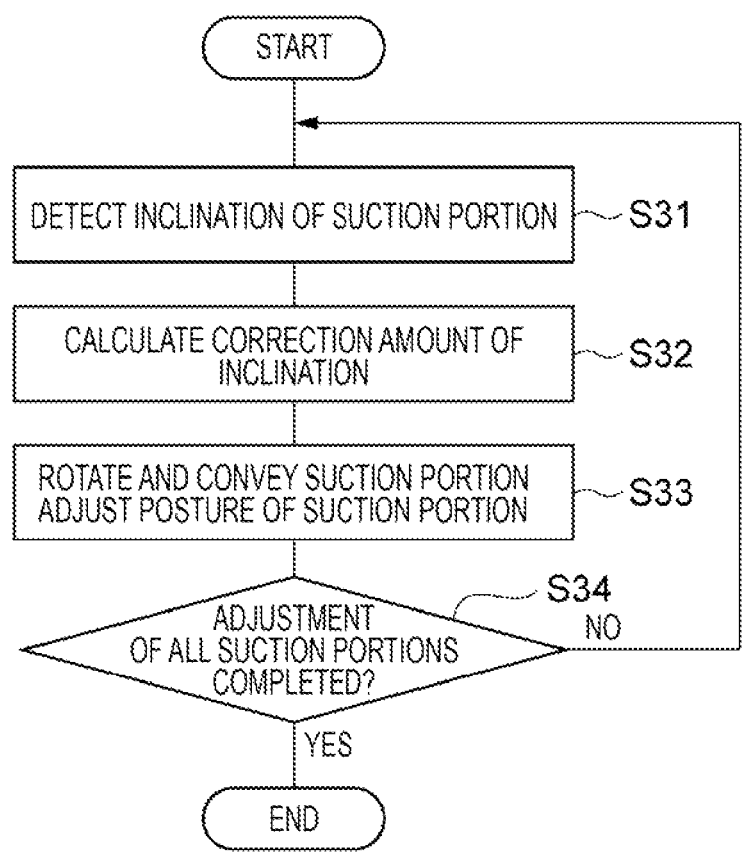
FIG. 8 is a flowchart illustrating an example of a series of processes of adjusting an inclination of the suction portion.

The controller 200 may cause the rotary conveyance unit 10 to perform the adjustment of the inclinations of the plurality of suction portions 22 before starting the conveyance of the electronic components W from the component supply unit 30 to the component collecting unit 60 via the rotary conveyance unit 10 (the plurality of suction portions 22). FIG. 8 is a flowchart illustrating an example of a series of processes of adjusting the inclinations of the plurality of suction portions 22 before the start of the conveyance of the electronic components W. In this series of processes, the controller 200 executes step S31 in the same manner as step S11 in a state in which any one of the suction portions 22 is disposed at the stop position SP for detection. Next, the controller 200 executes step S32 in the same manner as step S17.

Next, the controller 200 executes step S33. In step S33, for example, the turning control unit 202 controls the turning drive unit 16 so as to turn the turning unit 14 by the one angular pitch on the circular track CR. In step S33, for example, the posture control unit 208 causes the corresponding rotation drive unit 18 to rotate the suction portion 22 around the axis Ax2 by the correction amount obtained in step S32 such that the posture of the suction portion 22 approaches the ideal state. Accordingly, the inclination of the one suction portion 22 is adjusted.

Next, the controller 200 executes step S34. In step S34, for example, the controller 200 determines whether the adjustment of the inclinations of all the suction portions 22 is completed. In step S34, when it is determined that the adjustment of the inclinations of all the suction portions 22 is not completed (step S34: NO), the controller 200 repeats the processes of steps S31 to S33. On the other hand, in step S34, when it is determined that the adjustment of the inclinations of all the suction portions 22 is completed (step S34: YES), the controller 200 ends the series of processes. Thereafter, the controller 200 starts the conveyance of the electronic component W from the component supply unit 30 to the component collecting unit 60 via the rotary conveyance unit 10 (the plurality of suction portions 22). After the start of the conveyance, the controller 200 may perform the series of processes illustrated in FIG. 7 or may not perform the series of processes.

(Modification)

In a case in which a shape of the suction portion 22 is a rectangle when the facing surface 24 is viewed, the posture detection unit 110 may detect an inclination of the suction portion 22 by imaging a side surface of the suction portion 22 instead of the facing surface 24 of the suction portion 22. For example, the posture information acquisition unit 204 of the controller 200 may detect an inclination of the suction portion 22 in accordance with a width (for example, a width of a tip end) of the suction portion 22 in an image obtained by imaging the side surface of the suction portion 22. The posture information acquisition unit 204 may detect the inclination of the suction portion 22 by using a change in width of the tip end of the side surface of the suction portion 22 in accordance with the inclination of the suction portion 22. The camera 112 of the posture detection unit 110 may acquire an image of the suction portion 22 in a state in which the side surface of the imaging target faces the camera 112, or may acquire the image of the suction portion 22 in a state in which one side surface is inclined around the axis Ax2 with respect to a front-facing state.

Instead of capturing the image, the posture detection unit 110 may detect the inclination of the suction portion 22 by irradiating the side surface of the suction portion 22 with irradiation light such as a laser and measuring the width of the suction portion 22 based on reflected light or the like. For example, the posture detection unit 110 may include an irradiation portion that irradiates the side surface of the suction portion 22 with visible light, and a light receiving portion that receives the reflected light from the side surface. Alternatively, the posture detection unit 110 may include an irradiation portion that irradiates the side surface of the suction portion 22 with infrared light, and a light receiving portion that receives light transmitted through the suction portion 22.

The posture detection unit 110 may detect a posture of the suction portion 22 disposed at the stop position SP separated from the stop position SP1 for supply by two or more angular pitches in a direction opposite to a turning direction of the turning unit 14. The controller 200 (posture control unit 208) may cause the corresponding rotation drive unit 18 to rotate the suction portion 22 around the axis Ax2 in a state in which the suction portion 22 moves on the circular track CR.

The storage state detection unit 120 may detect the storage state of the electronic component W before the electronic component W is disposed at the receiving position P1. For example, the storage state detection unit 120 may detect the storage state of the electronic component W immediately before the electronic component W to be suctioned by the suction portion 22 to be adjusted is disposed at the receiving position P1 (before the electronic component W is disposed at the receiving position P1 by the movement of one pitch between centers of the adjacent electronic components W). In accordance with the inclination of the electronic component W detected immediately before the electronic component W is disposed at the receiving position P1, the posture control unit 208 may cause the corresponding rotation drive unit 18 to adjust the inclination of the suction portion 22 to which the electronic component W is to be suctioned. The first position control unit 212 may cause the container position adjuster 34 to move the container holder 32 (wafer sheet 44) such that the electronic component W is disposed at an ideal position when the electronic component W is disposed at the receiving position P1, in accordance with the position of the electronic component W detected immediately before the electronic component W is disposed at the receiving position P1.

According to the first embodiment, the processing apparatus 1 for the electronic component W includes the component holders 12 that hold the electronic components W, the turning unit 14 that holds the component holders 12 toward the outside of the predetermined circular track CR, the turning drive unit 16 that turns the turning portion 14 around the axis Ax1 (first axis) along the central axis of the circular track CR, and the rotation drive units 18 that are provided on the turning unit 14 and rotate the component holders 12 around the axis Ax2 (second axis) along the radial direction of the circular track CR.

In the processing apparatus 1, a posture of the component holder 12 itself is adjusted by rotating the component holder 12, which is held toward the outside of the circular track CR and holds the electronic component W, around the axis Ax2. Therefore, the component holder 12 can receive the electronic component W while the posture of the component holder 12 is brought close to the ideal state. Therefore, in a case in which the electronic component W is delivered to and from the component holder 12, it is useful to prevent a deviation of the posture of the component holder 12 with respect to the electronic component W. For example, as in the above-described example, in the case in which the suction portion 22 is used as the component holder 12 and the non-contactable range is set on one main surface of the electronic component W, it is possible to adjust the posture of the suction portion 22 before receiving the electronic component W, and it is possible to reduce the possibility that the suction portion 22 comes into contact with the non-contactable range when the electronic component W is delivered.

The processing apparatus 1 may include the container holders 32 that hold the container 42 storing the electronic component W to be supplied to the component holder 12 such that the container 42 faces the component holder 12, and the container position adjuster 34 (position adjuster) that changes the position of the container holder 32 along a plane intersecting the direction in which the container 42 and the component holder 12 face each other. In this case, a relative position between the component holder 12 and the electronic component W when the component holder 12 receives the electronic component W can be adjusted by the container position adjuster 34. As a result, in the case in which the electronic component W is delivered to and from the component holder 12, it is useful to prevent the deviation of the position of the component holder 12 with respect to the electronic component W. For example, when the container 42 is the wafer sheet 44, a moving mechanism that disposes the electronic component W to be supplied at a position where the component holder 12 receives the electronic component W can be used for adjusting the relative position between the component holder 12 and the electronic component W, and the processing apparatus 1 can be simplified.

The processing apparatus 1 may include the storage state detection unit 120 that detects the storage state of the electronic component W stored on the container 42. In this case, it is possible to rotate the component holder 12 around the axis Ax2 according to the inclination of the electronic component W detected by the storage state detection unit 120, and it is possible to more reliably prevent the deviation of the posture of the component holder 12 with respect to the electronic component W. It is possible to adjust the relative position between the component holder 12 and the electronic component W according to the position of the electronic component W detected by the storage state detection unit 120, and it is possible to more reliably prevent the deviation of the position of the component holder 12 with respect to the electronic component W.

The processing apparatus 1 may include the posture detection unit 110 that detects the inclination of the component holder 12 around the axis Ax2 (second axis). In this case, it is possible to rotate the component holder 12 around the axis Ax2 according to the inclination of the component holder 12 detected by the posture detection unit 110, and it is possible to more reliably prevent the deviation of the posture of the component holder 12 with respect to the electronic component W.

The processing apparatus 1 may include the advance and retract driving portion 28a that moves both the component holder 12 and the rotation drive unit 18 along the radial direction of the circular track CR. In this case, the electronic component W can be delivered in a state in which the component holder 12 is disposed outside the circular track CR. By moving both the component holder 12 and the rotation drive unit 18, it is possible to simplify a mechanism that transmits a driving force of the rotation drive unit 18 to the component holder 12 as compared with a case in which the component holder 12 is moved along the radial direction with respect to the rotation drive unit 18.

Second Embodiment

Figure 9:
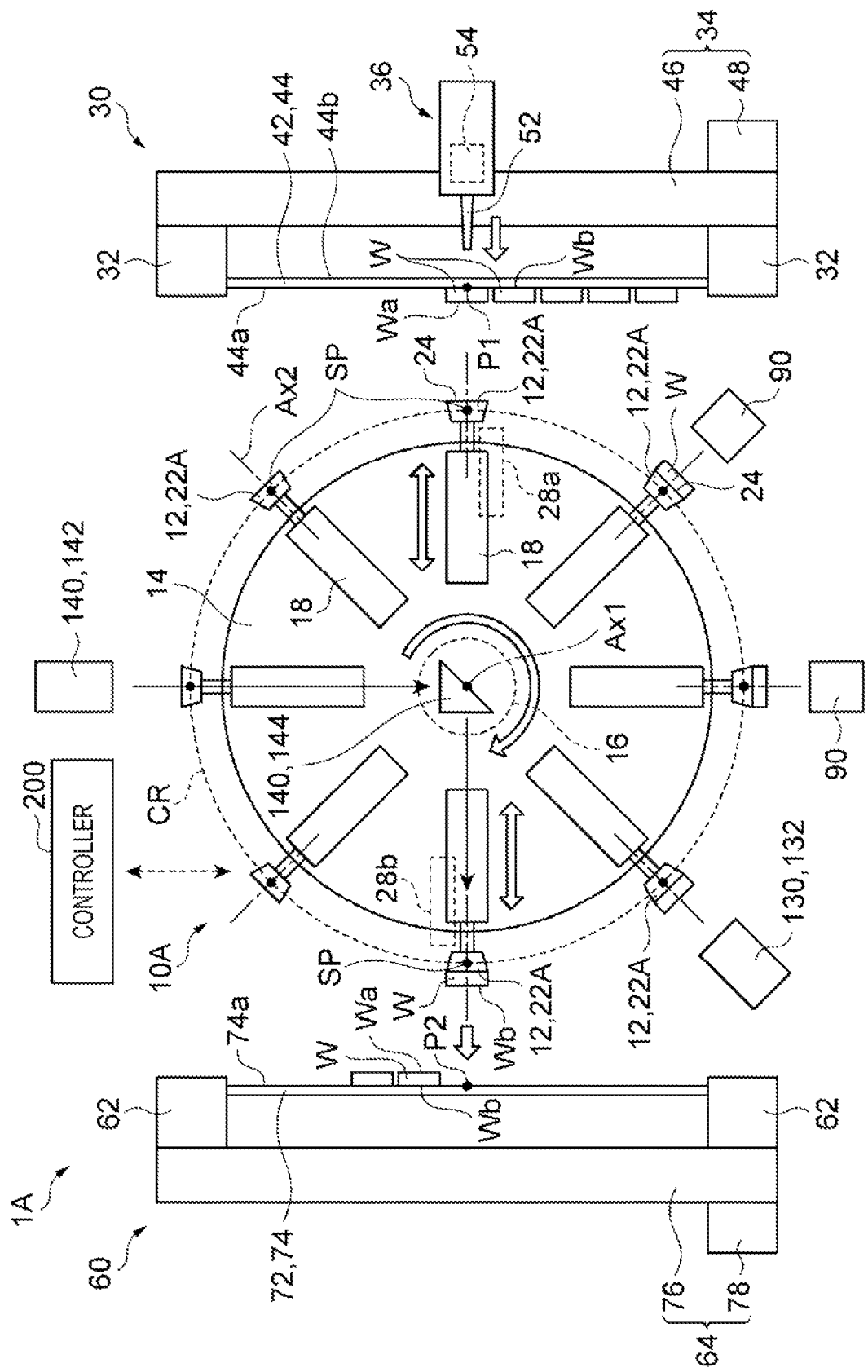
FIG. 9 is a side view schematically illustrating an example of a processing apparatus of an electronic component according to a second embodiment.

Instead of the adjustment of the inclination of the component holder 12, adjustment of an inclination of the electronic component W held by the component holder 12 may be executed. Moreover, instead of the adjustment of the position of the electronic component W to be supplied in the component supply unit 30, a position of a planned storage region of the electronic component W may be adjusted in the component collecting unit 60. A processing apparatus 1A according to a second embodiment illustrated in FIG. 9 is different from the processing apparatus 1 according to the first embodiment in that a rotary conveyance unit 10A is provided instead of the rotary conveyance unit 10, and a holding state detection unit 130 and a region detection unit 140 are provided instead of the posture detection unit 110 and the storage state detection unit 120. The rotary conveyance unit 10A includes suction portions 22A instead of the suction portions 22 as an example of the component holders 12.

Figure 10B:
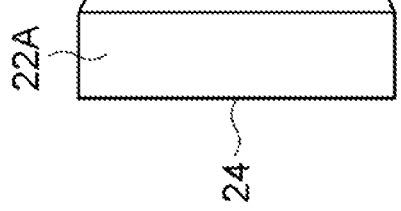
FIG. 10B is a side view schematically illustrating the example of the suction portion.

Unlike the electronic component W illustrated in FIG. 3A, the non-contactable range Cpa may not be set for the electronic component W to be conveyed by the rotary conveyance unit 10A. FIG. 10A and FIG. 10B illustrate an example of the suction portion 22A. As illustrated in FIG. 10A, the suction portion 22A has the circular suction hole 26 provided substantially at a center of the facing surface 24. When viewed from a direction perpendicular to the facing surface 24, a center of the suction hole 26 and the center of the facing surface 24 substantially coincide with each other. Unlike the suction portion 22 illustrated in FIG. 3A and FIG. 3C, the facing surface 24 of the suction portion 22A is formed to be flat as illustrated in FIG. 10B (a protruding portion including a contact surface is not provided).

Figure 10D:
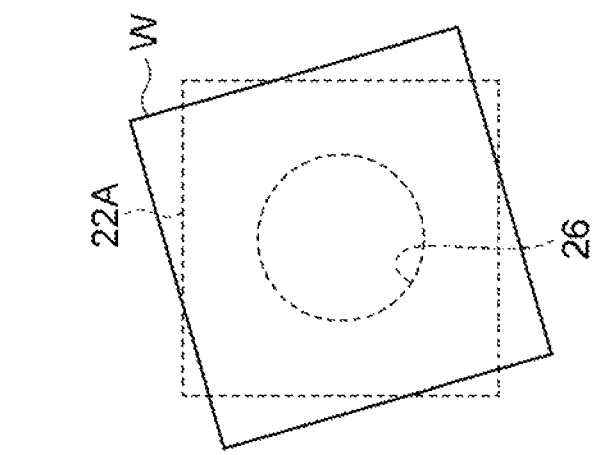
FIG. 10C and FIG. 10D are schematic views illustrating postures of the electronic component with respect to the suction portion.
Figure 10A:
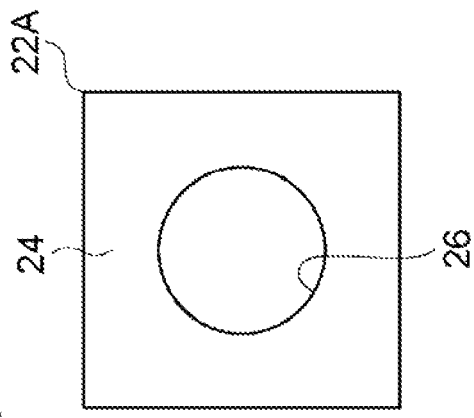
FIG. 10A is a front view schematically illustrating an example of a suction portion.
Figure 10C:
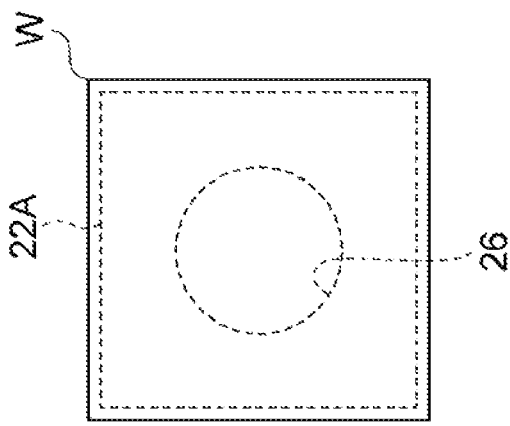

FIG. 10C and FIG. 10D illustrate postures of the electronic component W with respect to the suction portion 22A (facing surface 24) when the suction portion 22A suctions the electronic component W. FIG. 10C illustrates an example of a positional relationship between the suction portion 22A and the electronic component W in a case in which suction is performed in a state in which the posture of the electronic component W is ideal. FIG. 10D illustrates an example of the positional relationship between the suction portion 22A and the electronic component W in a case in which the suction is performed in a state (state in which the electronic component W is inclined with respect to an ideal state) in which the posture of the electronic component W is deviated from the ideal state.

When the posture of the electronic component W suctioned by the suction portion 22A is in the ideal state, for example, with respect to a virtual reference line along one side of an outer edge of the facing surface 24, one corresponding side of an outer edge of the electronic component W (main surface Wa) is substantially parallel. When the posture of the electronic component W suctioned by the suction portion 22A is deviated from the ideal state, for example, the corresponding side of the outer edge of the electronic component W (main surface Wa) is inclined with respect to the above-described virtual reference line. In the component collecting unit 60, when the electronic component W is delivered from the suction portion 22A to the container 72 in a state in which the electronic component W is inclined, the electronic component W may be stored on the container 72 in a state in which the electronic component W is inclined. Therefore, it is necessary to deliver the electronic component W to the container 72 by bringing the inclination of the electronic component W close to zero.

Similarly to the rotary conveyance unit 10 according to the first embodiment, the rotation drive unit 18 of the rotary conveyance unit 10A rotates the corresponding suction portion 22A around the axis Ax2. By the rotation drive unit 18, the suction portion 22A in a state of suctioning the electronic component W rotates around the axis Ax2, and thus the electronic component W also rotates around the axis Ax2. When the electronic component W rotates around the axis Ax2, the posture (inclination) of the electronic component W held by the suction portion 22A is adjusted. The inclination of the electronic component W with respect to the reference line along the one side of the outer edge of the facing surface 24 of the suction portion 22A before the rotation is adjusted.

The holding state detection unit 130 detects a holding state of the electronic component W suctioned by the suction portion 22A. More specifically, the holding state detection unit 130 detects the holding state of the electronic component W suctioned by the suction portion 22A disposed at any stop position SP located on a path (the above-described conveyance path) of the circular track CR on which the electronic component W is conveyed. Hereinafter, a stop position SP at which the suction portion 22A suctioning the electronic component W to be detected by the holding state detection unit 130 is disposed is referred to as a "stop position SP for detection". In an example shown in FIG. 9, the stop position SP for detection is set to a stop position separated from the stop position SP for collecting by one angular pitch in a direction opposite to a turning direction of the turning unit 14.

For example, the holding state detection unit 130 detects, as the holding state of the electronic component W, the inclination (inclination from the ideal state) around the axis Ax2 of the electronic component W suctioned by the suction portion 22A. The holding state detection unit 130 detects, as the holding state of the electronic component W, the position (position of the electronic component W with respect to the ideal position in a suctioned state) of the electronic component W suctioned by the suction portion 22A. When the electronic component W suctioned by the suction portion 22A is held at the ideal position, the center of the facing surface 24 and a center of the suction portion 22A may substantially coincide with each other.

The holding state detection unit 130 may include a camera 132. The camera 132 is disposed such that the electronic component W suctioned by the suction portion 22A disposed at the stop position SP for detection can be imaged. For example, the camera 132 is disposed outside the circular track CR such that the entire main surface Wb of the electronic component W in the state of being suctioned by the suction portion 22A can be imaged. The camera 132 includes an imaging element such as a CCD image sensor or a CMOS image sensor, and a lens that forms an image on the imaging element.

The region detection unit 140 detects a region where the electronic component W is to be stored on the container 72 (second container: for example, the wafer sheet 74). For example, the region detection unit 140 detects the position of the planned storage region after the wafer sheet 74 is moved such that a region (planned storage region) in which the electronic component W is to be stored is disposed at the transfer position P2. For example, since the wafer sheet 74 does not have a configuration of determining a storage position of each of the electronic components W, the position of the planned storage region on the wafer sheet 74 is determined such that an interval (for example, an interval between centers) between adjacent electronic components W when the electronic component W is stored in the region becomes a predetermined set value (see a planned storage region RA in FIG. 11A).

The region detection unit 140 may include a camera 142 and a mirror member 144. The camera 142 images, for example, the planned storage region and a periphery thereof (at least a part of the electronic components W stored on the wafer sheet 74 and located around the planned storage region) from an inside of the circular track CR. The camera 142 may be disposed outside the circular track CR above the rotary conveyance unit 10A. The camera 142 includes an imaging element such as a CCD image sensor or a CMOS image sensor, and a lens that forms an image on the imaging element.

The mirror member 144 is disposed in a manner of providing a viewpoint for imaging the planned storage region and the periphery thereof on an inner side of the circular track CR. The mirror member 144 is disposed at a center of the circular track CR, and reflects light introduced into the mirror member 144 from the planned storage region and the periphery thereof toward the camera 142. The mirror member 144 may be configured in any manner as long as the mirror member 144 includes a reflective surface that reflects the light toward the camera 142. For example, the mirror member 144 may be a plate-shaped mirror, or may be a prism configured and disposed such that one surface thereof serves as the reflective surface. The camera 142 may image the planned storage region and the periphery thereof via the mirror member 144 in a state (timing) in which none of the members are disposed on an optical path passing through the transfer position P2, the mirror member 144, and the camera 142.

The controller 200 may include a second state information acquisition unit 222 and a third state information acquisition unit 224 as functional modules (see FIG. 5). The second state information acquisition unit 222 detects, by the holding state detection unit 130, information indicating the holding state (for example, the inclination and the position) of the electronic component W suctioned by the suction portion 22A disposed at the stop position SP for detection. For example, the second state information acquisition unit 222 causes the camera 132 of the holding state detection unit 130 to acquire an image of the main surface Wb of the electronic component W in a state in which any one of the suction portions 22 suctioning the electronic component W is disposed at the stop position SP for detection.

The third state information acquisition unit 224 detects, by the region detection unit 140, information indicating the planned storage region (for example, a position) of the electronic component W on the wafer sheet 74. For example, the third state information acquisition unit 224 causes the camera 142 of the region detection unit 140 to acquire an image of the planned storage region and the periphery thereof in the state in which the wafer sheet 74 is moved such that the planned storage region is disposed at the transfer position P2.

The posture control unit 208 controls the corresponding rotation drive unit 18 to adjust the inclination of the electronic component W according to a detection result of the inclination around the axis Ax2 of the electronic component W held by the suction portion 22A. More specifically, the posture control unit 208 controls the corresponding rotation drive unit 18 such that the inclination of the electronic component W held by the suction portion 22A approaches zero (the posture of the electronic component W approaches the ideal state) before the electronic component W to be adjusted is delivered to the wafer sheet 74. For example, by bringing the inclination of the electronic component W close to zero, the outer edge of the electronic component W (main surface Wa) can be aligned with an arrangement direction of the plurality of electronic components W when the electronic component W is attached to the wafer sheet 74.

The second position control unit 214 controls the container position adjuster 64 (second position adjuster) according to a detection result of the position of the planned storage region and a detection result of the position of the electronic component W suctioned by the suction portion 22A. More specifically, the second position control unit 214 causes the container position adjuster 64 to move the container holders 62 (second container holder) in accordance with the position of the planned storage region and the position of the electronic component W suctioned by the suction portion 22A such that a difference between the position of the planned storage region and the position of the electronic component W approaches zero when the electronic component W is actually attached onto the wafer sheet 74. By bringing the difference between the position of the planned storage region and the position of the attached electronic component W close to zero, pitches between the plurality of electronic components W attached to the wafer sheet 74 can be brought close to equal intervals.

Figure 11A:
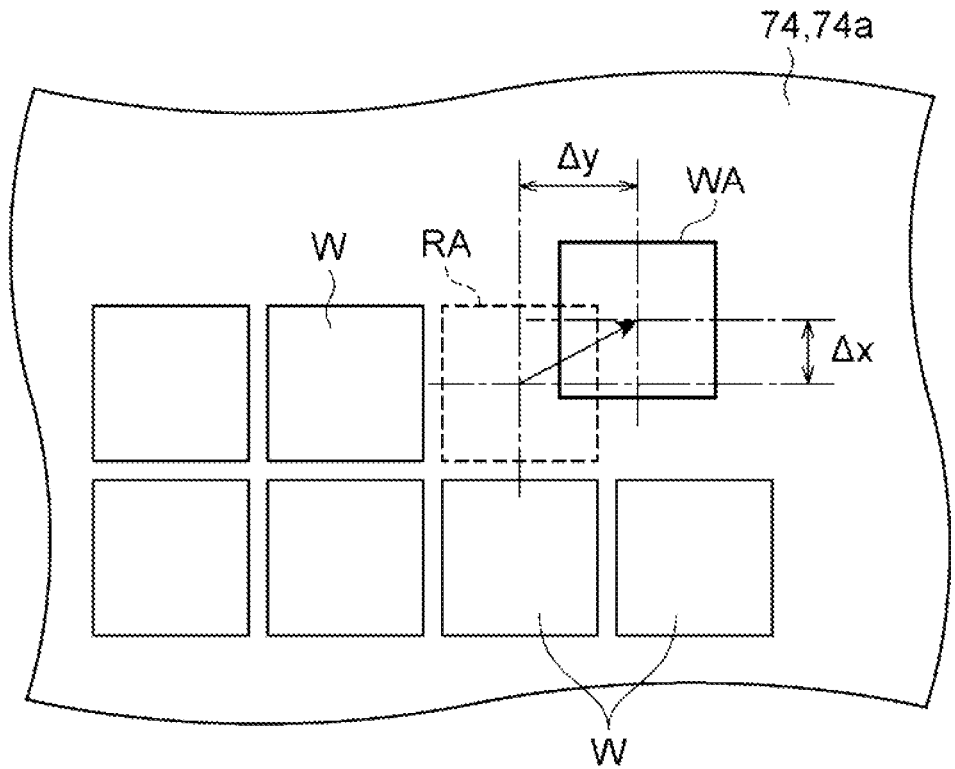
FIG. 11A and FIG. 11B are schematic views illustrating an example of a method for correcting a storage position of the electronic component.
Figure 11B:
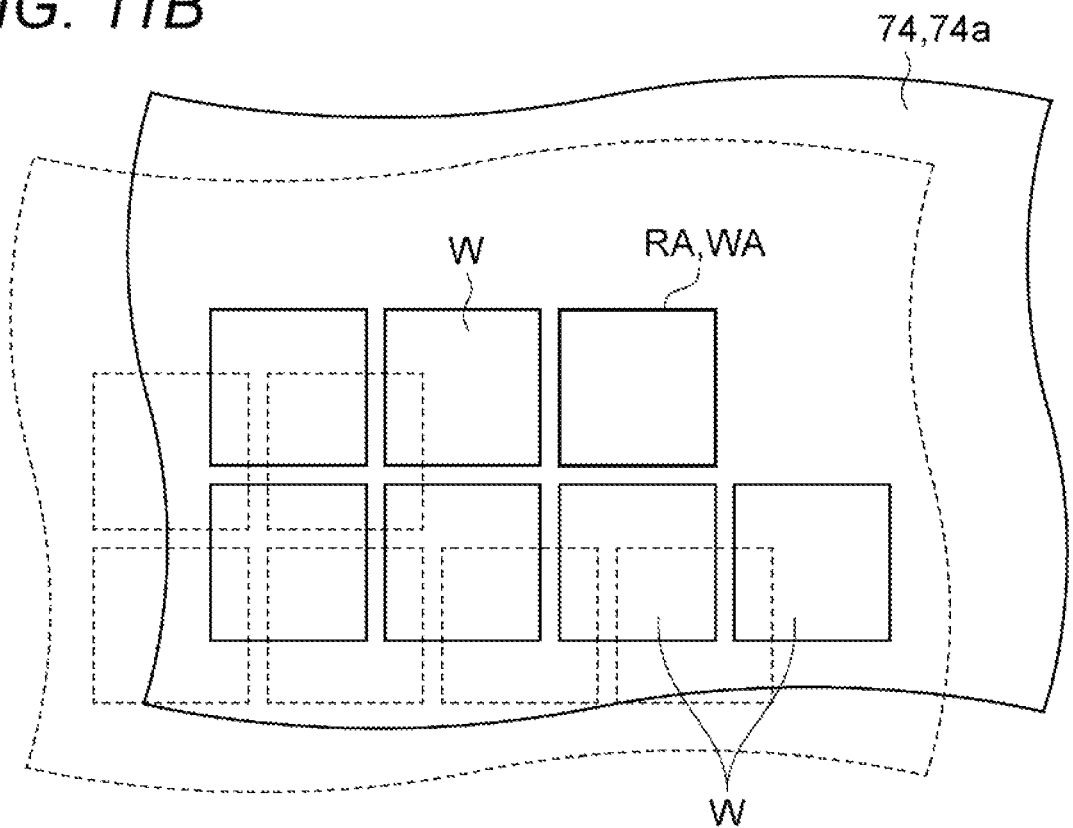

When the adjustment of the relative position between the planned storage region and the suction portion 22A is not performed, as illustrated in FIG. 11A, a deviation may occur between the planned storage region RA (region where the electronic component W is to be stored) and a planned attachment region WA of the electronic component W (region where the electronic component W is to be actually attached). In FIG. 11A, the deviation is indicated by Δx and Δy, and is caused by a deviation of the position of the electronic component W suctioned by the suction portion 22A from the ideal position and a deviation (deviation of a pitch movement amount) of the planned storage region from the ideal position due to movement of the wafer sheet 74 for disposing the planned storage region at the transfer position P2. As illustrated in FIG. 11B, the second position control unit 214 causes the container position adjuster 64 to move the container holder 62 (wafer sheet 74) such that a difference between the planned storage region RA and the planned attachment region WA approaches zero.

Figure 12:
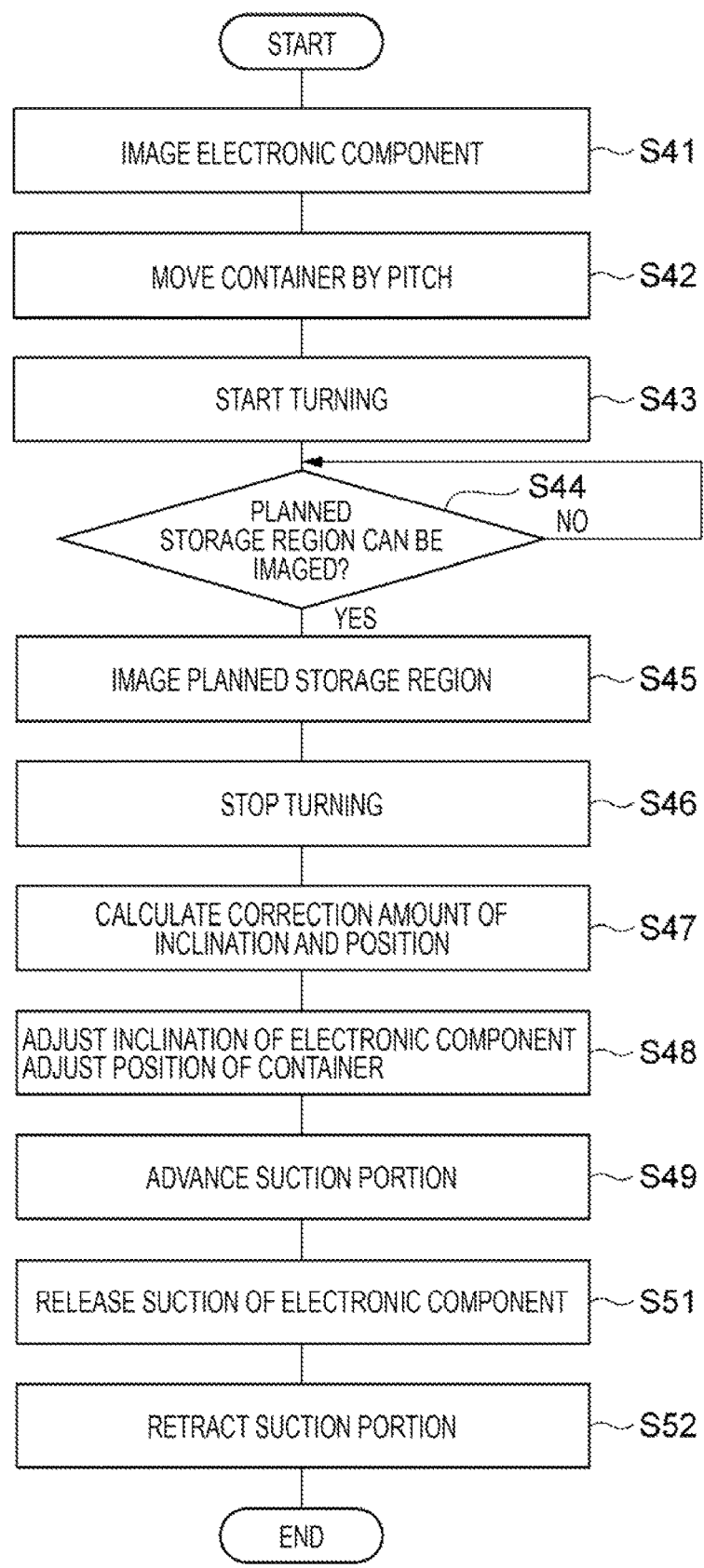
FIG. 12 is a flowchart illustrating an example of a series of processes until the suction portion transfers the electronic component.

Next, as an example of a method for processing an electronic component (control procedure executed by the controller 200), a series of processes until the suction portion 22A transfers the electronic component W will be described. FIG. 12 is a flowchart illustrating an example of the series of processes until one suction portion 22A transfers the electronic component W.

The controller 200 sequentially executes steps S41 and S42 in a state in which the suction portion 22A suctioning the electronic component W is disposed at the stop position SP for detection. In step S41, for example, the second state information acquisition unit 222 causes the camera 132 of the holding state detection unit 130 to acquire an image of the electronic component W suctioned by the suction portion 22A disposed at the stop position SP for detection. In step S42, for example, the second position control unit 214 controls the container position adjuster 64 such that the planned storage region for the electronic component W for which the image is acquired in step S41 is disposed at the transfer position P2 on the wafer sheet 74.

Next, the controller 200 sequentially executes steps S43 and S44. In step S43, for example, the turning control unit 202 causes the turning drive unit 16 to start intermittent turn of the turning unit 14 by one angular pitch on the circular track CR. In step S44, for example, the third state information acquisition unit 224 waits until imaging of the planned storage region and the periphery thereof becomes possible.

In one example, the third state information acquisition unit 224 waits until a timing at which none of the members are positioned on an optical path passing through the transfer position P2, the mirror member 144, and the camera 142. The timing is stored in advance in the controller 200, for example.

Next, the controller 200 sequentially executes steps S45 and S46. In step S45, for example, the third state information acquisition unit 224 causes the camera 142 of the region detection unit 140 to acquire an image of the planned storage region on the wafer sheet 74 and the periphery thereof. In step S46, for example, the turning control unit 202 causes the turning drive unit 16 to stop the turn of the turning unit 14 by the one angular pitch on the circular track CR. Through the processing up to step S46, the suction portion 22A suctioning the electronic component W to be collected is disposed at the stop position SP for collecting.

Next, the controller 200 executes step S47. In step S47, for example, the posture control unit 208 calculates a correction amount of the inclination of the electronic component W according to the inclination of the electronic component W detected based on the image obtained in step S41. The posture control unit 208 calculates the correction amount of the inclination of the electronic component W such that the inclination of the electronic component W approaches zero (such that the posture of the electronic component W approaches the ideal state).

In step S47, for example, the second position control unit 214 calculates a correction amount of a position of the container holder 62 (wafer sheet 74) according to the position of the electronic component W detected based on the image obtained in step S41 and the position of the planned storage region detected based on the image obtained in step S45. In one example, the second position control unit 214 calculates the correction amount of the position of the container holder 62 such that the difference between the position of the planned storage region and the position of the electronic component W approaches zero when the electronic component W is actually attached to the wafer sheet 74.

Next, the controller 200 executes step S48. In step S48, for example, the posture control unit 208 controls the corresponding rotation drive unit 18 so as to rotate the electronic component W (suction portion 22A) around the axis Ax2 by the correction amount (rotation amount according to the correction amount) of the inclination calculated in step S47. In step S48, for example, the second position control unit 214 controls the container position adjuster 64 to move the container holder 62 (wafer sheet 74) by the correction amount (movement amount according to the correction amount) of the position calculated in step S47.

Next, the controller 200 sequentially executes steps S49, S50, and S51. For example, in step S49, the second delivery control unit 218 causes the advance and retract driving portion 28b to advance the suction portion 22A disposed at the stop position SP for collecting to the outside of the circular track CR until the main surface Wb of the electronic component W suctioned by the suction portion 22A comes into contact with the wafer sheet 74. In step S50, for example, the second delivery control unit 218 causes the suction portion 22A to release the suction of the electronic component W in contact with the wafer sheet 74. In step S51, for example, the second delivery control unit 218 causes the advance and retract driving portion 28b to retreat the advanced suction portion 22A. Accordingly, the electronic component W is transferred from the suction portion 22A to the wafer sheet 74.

The controller 200 may also execute the series of processes of steps S41 to S51 for the other suction portions 22A (other electronic components W). Accordingly, the plurality of suction portions 22A sequentially transfer one electronic component W to the wafer sheet 74. The controller 200 may start the series of processes of steps S41 to S51 for the other suction portions 22A (suction portions 22A that transfer the subsequent electronic components W) from the middle of the series of processes of steps S41 to S51 for the one suction portion 22A (for example, after the execution of step S46).

(Modification)

In step S47, the controller 200 may calculate a correction amount of an inclination of the electronic component W without calculating a correction amount of a position of a planned storage region. In this case, in step S48, the controller 200 may adjust the inclination of the electronic component W by the rotation drive unit 18 corresponding to the suction portion 22A which suctions the electronic component W to be adjusted, without causing the container position adjuster 64 to perform adjustment of a position of the container 72 (wafer sheet 74).

In a case in which a shape of the electronic component W is a rectangle when the main surface Wb is viewed, the holding state detection unit 130 may detect the inclination of the electronic component W by imaging a side surface (surface connecting the main surfaces Wa and Wb) of the electronic component W instead of the main surface Wb. The camera 132 of the holding state detection unit 130 may acquire an image of the electronic component W in a state in which the side surface of the imaging target faces the camera 132, or may acquire the image of the electronic component W in a state in which one side surface is disposed in a manner of being inclined by a predetermined angle around the axis Ax2 from a front-facing state.

The second state information acquisition unit 222 of the controller 200 may detect the inclination of the electronic component W in accordance with a width of the electronic component W in the image obtained by imaging the side surface of the electronic component W. The processing apparatus 1A may perform visual inspection on a plurality of side surfaces of the electronic component W using the camera 132 capable of imaging the side surfaces of the electronic component W. For example, the controller 200 may cause the camera 132 to sequentially image the plurality of side surfaces of the electronic component W by rotating the electronic component W around the axis Ax2 by the rotation drive unit 18, and perform the visual inspection of the electronic component W based on captured images.

Instead of capturing the image, the holding state detection unit 130 may detect the inclination of the electronic component W by irradiating the side surface of the electronic component W with irradiation light such as a laser and measuring the width of the electronic component W based on reflected light or the like. For example, the holding state detection unit 130 may include an irradiation portion that emits visible light toward the side surface of the electronic component W and a light receiving portion that receives the reflected light from the side surface. Alternatively, the holding state detection unit 130 may include an irradiation portion that emits infrared light toward the side surface of the electronic component W, and a light receiving portion that receives transmitted light transmitted through the electronic component W.

The holding state detection unit 130 may detect a posture of the electronic component W suctioned by the suction portion 22A disposed at the stop position SP separated from the stop position SP for collecting by two or more angular pitches in a direction opposite to a turning direction of the turning unit 14. The controller 200 (posture control unit 208) may rotate the electronic component W around the axis Ax2 by the corresponding rotation drive unit 18 in a state in which the suction portion 22A moves on the circular track CR.

The region detection unit 140 may detect a planned storage region (position) of the electronic component W to be collected next before the planned storage region is disposed at the transfer position P2. For example, the region detection unit 140 may detect the position of the planned storage region immediately before the planned storage region for the electronic component W to be adjusted is disposed at the transfer position P2 (before the planned storage region is disposed at the transfer position P2 by the movement of one pitch of centers of the adjacent electronic components W on the wafer sheet 74). The second position control unit 214 may cause the container position adjuster 64 to move the container holder 62 such that the electronic component W is positioned at the planned storage region (such that a deviation amount approaches zero) when the electronic component W is stored on the wafer sheet 74, according to the position of the planned storage region and the position of the electronic component W to be stored in the planned storage region.

In the controller 200 of the processing apparatus 1A, similarly to the processing apparatus 1 of the first embodiment, an inclination of the suction portion 22A before suctioning the electronic component W may be adjusted, or the position of the electronic component W disposed at the receiving position P1 may be adjusted before the suctioning of the suction portion 22A.

According to the second embodiment, the processing apparatus 1A for the electronic component W includes the component holders 12 that hold the electronic components W, the turning unit 14 that holds the component holders 12 toward the outside of the predetermined circular track CR, the turning drive unit 16 that turns the turning unit 14 around the axis Ax1 (first axis) along the central axis of the circular track CR, and the rotation drive units 18 that are provided on the drive unit 14 and rotate the component holders 12 around the axis Ax2 (second axis) along the radial direction of the circular track CR.

In the processing apparatus 1A, the posture of the electronic component W held by the component holder 12 is adjusted by rotating the component holder 12 holding the electronic component W positioned outside the circular track CR around the axis Ax2. Therefore, the electronic component W can be transferred by the component holder 12 while the posture of the electronic component W is brought close to the ideal state. Therefore, in a case in which the electronic component W is delivered to and from the component holder 12, it is useful to prevent the deviation of the posture of the electronic component W after the delivery. For example, as a method for adjusting the posture (inclination) of the electronic component W, it is conceivable to provide an alignment unit that once receives the electronic component W from the suction portion 22A, adjusts the posture, and then returns the adjusted electronic component W to the suction portion 22A. However, in this case, it is necessary to deliver the electronic component W along with the posture adjustment, and a possibility of falling of the electronic component W increases due to an increase in the number of times of delivery. On the other hand, in the processing apparatus 1A, since the delivery of the electronic component W is not performed for the posture adjustment of the electronic component W, it is possible to reduce the possibility that the electronic component W falls.

The processing apparatus 1A may include container holders 62 (second container holders) that holds the container 72 (second container) storing the electronic component W collected from the component holder 12 such that the container 72 faces the component holder 12, and a container position adjuster 64 (second position adjuster) that changes the position of the container holder 62 along a surface intersecting a direction in which the container holder 62 and the component holder 12 face each other. In this case, when the component holder 12 transfers the electronic component W, a relative position between the component holder 12 and the planned storage region can be adjusted by the container position adjuster 64. As a result, in the case in which the electronic component W is delivered to and from the component holder 12, it is useful to prevent the deviation of the position of the electronic component W after the delivery. For example, when the container 72 is the wafer sheet 74, a moving mechanism that disposes the planned storage region at a position for receiving the electronic component W from the component holder 12 can also be used for adjusting the relative position between the component holder 12 and the planned storage region, and the processing apparatus 1A can be simplified.

The processing apparatus 1A may include the holding state detection unit 130 that detects a holding state of the electronic component W held by the component holder 12, and the region detection unit 140 that detects a region where the electronic component W is to be stored on the container 72 (second container). In this case, it is possible to rotate the electronic component W (component holder 12) around the axis Ax2 in accordance with the inclination of the electronic component W detected by the holding state detection unit 130, and it is possible to more reliably prevent the deviation of the posture of the electronic component W after the delivery. A relative position between the electronic component W held by the component holder 12 and the planned storage region can be adjusted according to the position of the electronic component W detected by the holding state detection unit 130 and the position of the planned storage region detected by the region detection unit 140, and it is possible to more reliably prevent the deviation of the position of the electronic component W after the delivery.

Third Embodiment

Figure 13:
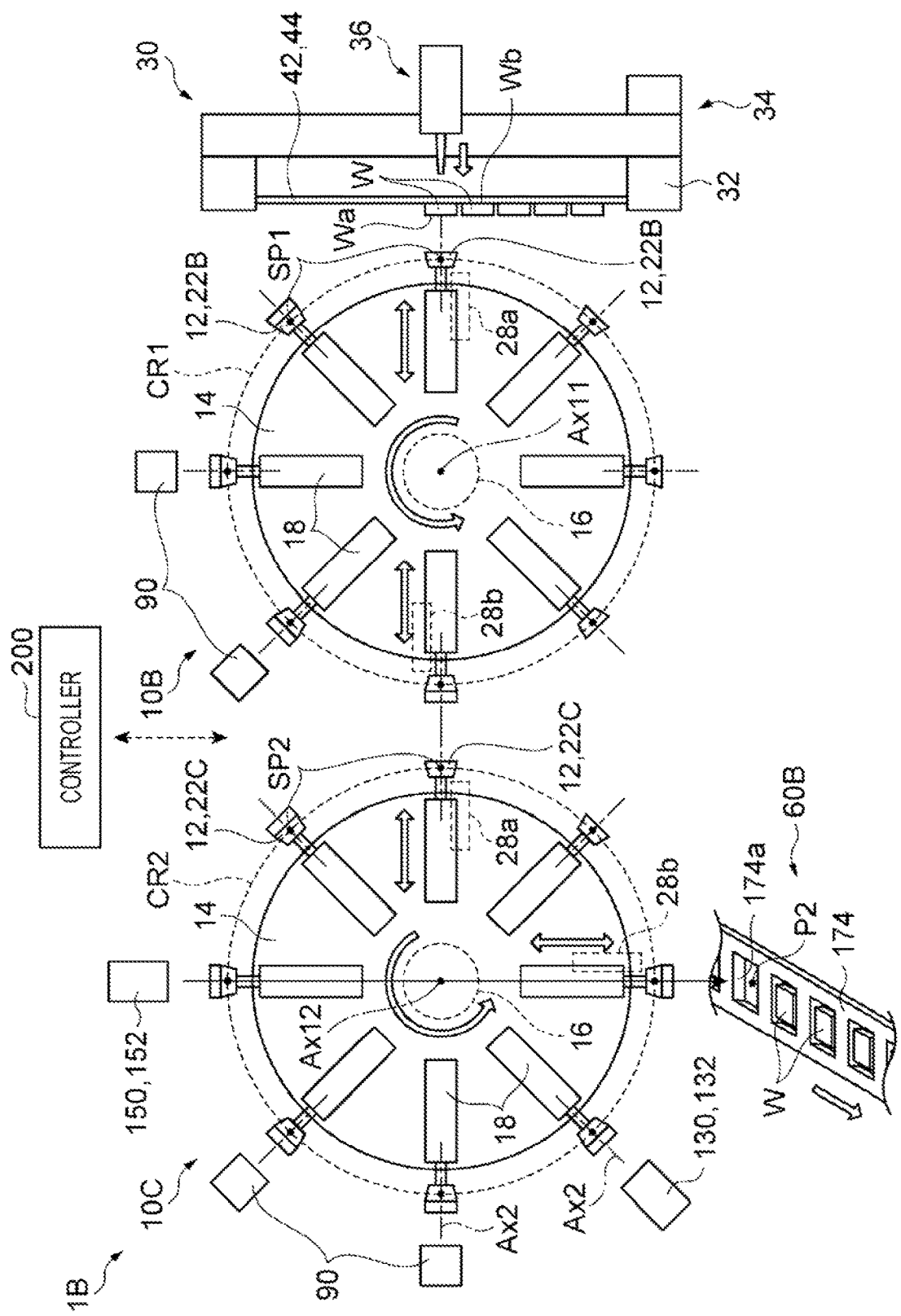
FIG. 13 is a side view schematically illustrating an example of a processing apparatus of an electronic component according to a third embodiment.

A plurality of electronic components W may be sequentially conveyed by two or more rotary conveyance units, and a carrier tape or a tray may be used instead of the wafer sheet as an container that stores the electronic components W to be collected. A processing apparatus 1B for an electronic component according to a third embodiment illustrated in FIG. 13 is different from the processing apparatus 1A according to the second embodiment in that rotary conveyance units 10B and 10C are provided instead of the rotary conveyance unit 10A, a region detection unit 150 is provided instead of the region detection unit 140, and a component collecting unit 60B is provided instead of the component collecting unit 60. The rotary conveyance units 10B and 10C include suction portions 22B and suction portions 22C instead of the suction portions 22A, respectively, as an example of the component holders 12.

The rotary conveyance unit 10B is configured in the same manner as the rotary conveyance unit 10A, and conveys the suction portions 22B along a circular track CR1 around a horizontal central axis. The turning drive unit 16 of the rotary conveyance unit 10B intermittently turns the turning unit 14 around an axis Ax11 along the central axis of the circular track CR1. The rotary conveyance unit 10C is configured in the same manner as the rotary conveyance unit 10A, and conveys the suction portions 22C along a circular track CR2 around a horizontal central axis. A turning drive unit 16 of the rotary conveyance unit 10C intermittently turns the turning unit 14 around an axis Ax12 (first axis) along the central axis of the circular track CR2. The axis Ax11 and the axis Ax12 (rotary conveyance units 10B and 10C) are arranged side by side in a horizontal direction. Hereinafter, positions at which the suction portions 22B of the plurality of component holders 12 in the rotary conveyance unit 10B stop on the circular track CR1 are referred to as "stop positions SP1", and positions at which the suction portions 22C of the plurality of component holders 12 in the rotary conveyance unit 10C stop on the circular track CR2 are referred to as "stop positions SP2".

The rotary conveyance unit 10B receives one electronic component W from the component supply unit 30 at the stop position SP1 (stop position SP1 for supply) disposed at one end in the horizontal direction. The rotary conveyance unit 10B conveys the received electronic component W (electronic component W suctioned by the suction portion 22B) in an order of the stop position SP1 for supply, the uppermost stop position SP1, and the stop position SP1 disposed at the other end in the horizontal direction.

The rotary conveyance unit 10C receives one electronic component W from the rotary conveyance unit 10B at the stop position SP2 (stop position SP2 closest to the circular track CR1) disposed at one end in the horizontal direction. In this manner, the electronic component W is delivered between the rotary conveyance unit 10B and the rotary conveyance unit 10C in a delivery region including the stop positions SP1 and SP2 close to each other. The rotary conveyance unit 10C conveys the received electronic component W (electronic component W suctioned by the suction portion 22C) from the stop position SP2 in the delivery region to the uppermost stop position SP2 and the lowermost stop position SP2 in this order.

The component collecting unit 60B collects the electronic component W from the rotary conveyance unit 10C at any one (for example, the lowermost stop position SP2) of the plurality of stop positions SP2. Hereinafter, the stop position SP2 at which the electronic component W is collected is referred to as a "stop position SP2 for collecting". When the stop position SP2 for collecting is located at the lowermost position, the facing surface 24 of the suction portion 22C disposed at the stop position SP2 is in a horizontal state. In the component collecting unit 60B, a carrier tape 174 is disposed as the container (second container) that stores the plurality of electronic components W to be collected.

The carrier tape 174 stores the plurality of electronic components W such that the electronic components W are arranged along one line. The carrier tape 174 stores, for example, the plurality of electronic components W and includes a plurality of pockets 174a arranged along one line. In the carrier tape 174, the electronic component W is stored in a space in the pocket 174a. Each of the plurality of pockets 174a (inner spaces) is formed in a shape corresponding to the electronic component W, and an outer edge of the pocket 174a is, for example, quadrangular in a plan view. In FIG. 13, a schematic view of the rotary conveyance units 10B and 10C and the component supply unit 30 when viewed from a side is illustrated, but a schematic perspective view of the carrier tape 174 is illustrated.

Figure 14:
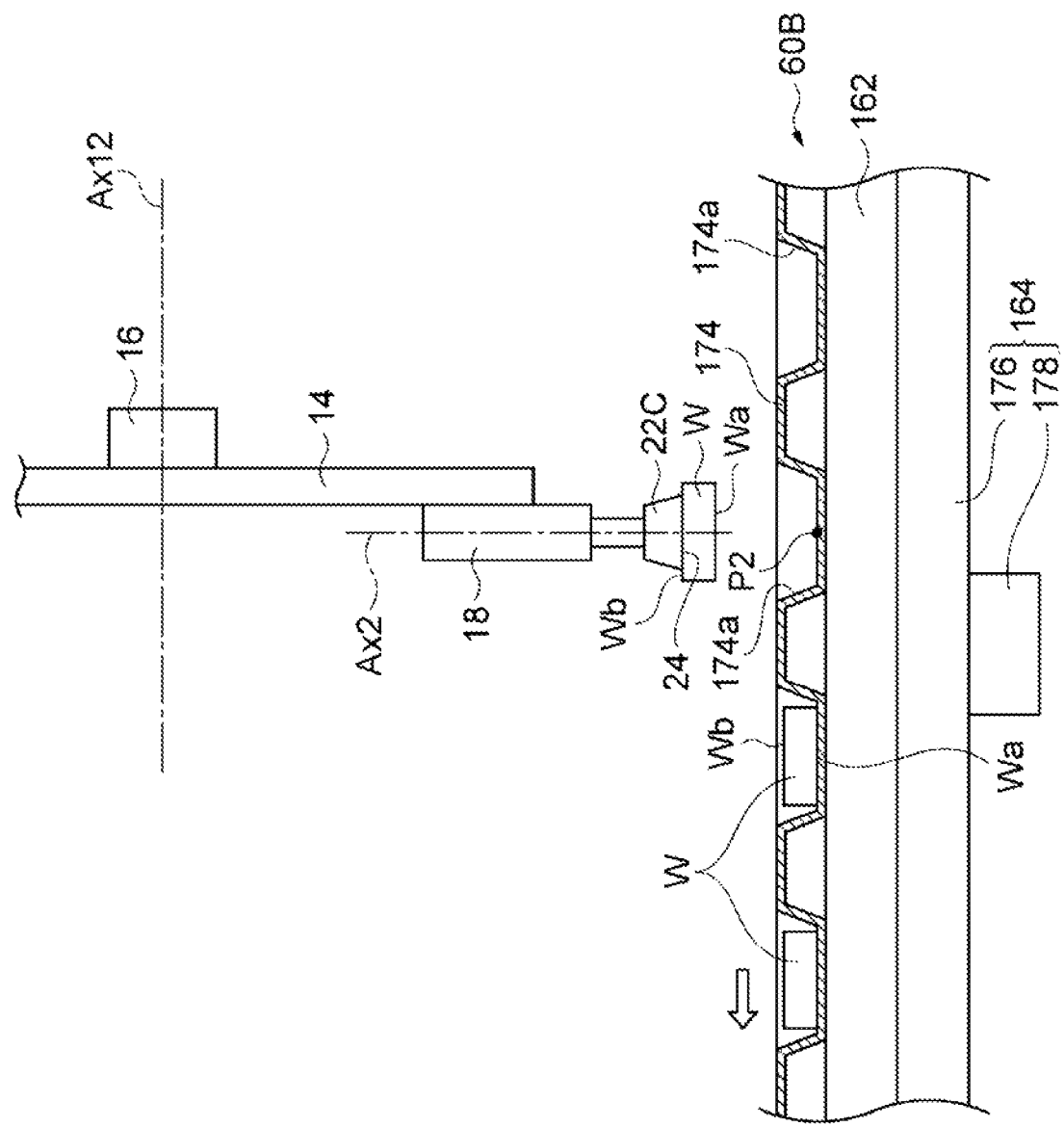
FIG. 14 is a side view schematically illustrating an example of the processing apparatus of the electronic component.

For example, as illustrated in FIG. 14, component collecting unit 60B includes a container holder 162 (second container holder) and a container position adjuster 164 (second container position adjuster). The container holder 162 holds the carrier tape 174 around the circular track CR2 such that the carrier tape 174 faces the suction portion 22C in a state of being disposed at the stop position SP2 for collecting. The container holder 162 may hold the carrier tape 174 such that the plurality of electronic components W are stored in a state of being arranged along a line parallel to the axis Ax12 of the circular track CR2. The container holder 162 may be configured to intermittently move the carrier tape 174 along an arrangement direction in which the pockets 174a on the carrier tape 174 are arranged. For example, the container holder 162 may repeat movement and stop at an interval (pitch) between centers of the adjacent pockets 174a such that the plurality of pockets 174a are sequentially disposed at the transfer position P2 vertically below the stop position SP2 for collecting.

The container position adjuster 164 adjusts a position of the container holder 162 along a plane intersecting a direction (radial direction of the circular track CR2) in which the carrier tape 174 and the suction portion 22C face each other. For example, the container position adjuster 164 changes the position of the container holder 162 along the plane perpendicular to the direction in which the carrier tape 174 and the facing surface 24 of the suction portion 22C positioned at the stop position SP2 for collecting face each other. By changing the position of the container position adjuster 164, a position of the carrier tape 174 held by the container holder 162 is changed. As a result, positions of the plurality of pockets 174a (empty pockets 174a in which the electronic components W are to be stored) on the carrier tape 174 are changed.

The container position adjuster 164 may change the position of the container holder 162 in two directions along the facing surface 24 of the suction portion 22C positioned at the stop position SP2 for collecting. In one example, the container position adjuster 164 includes a first drive portion 176 and a second drive portion 178. The first drive portion 176 moves the container holder 162 (carrier tape 174) in a direction along the axis Ax12 of the circular track CR2 by a power source such as an electric motor. The second drive portion 178 moves the container holder 162 (carrier tape 174) along the horizontal direction perpendicular to the axis Ax12 of the circular track CR2 by a power source such as an electric motor. The first drive portion 176 of the container position adjuster 164 may repeat movement and stop of the carrier tape 174 at the interval (pitch) between the centers of the adjacent pockets 174a without the container holder 162 having a function of moving the carrier tape 174.

Similarly to the holding state detection unit 130 of the processing apparatus 1A, the holding state detection unit 130 of the processing apparatus 1B detects a holding state (position and inclination) of the electronic component W suctioned by the suction portion 22C. More specifically, the holding state detection unit 130 of the processing apparatus 1B detects the holding state of the electronic component W suctioned by the suction portion 22C disposed at any stop position SP positioned on a path of the circular track CR2 on which the electronic component W is conveyed. Hereinafter, the stop position SP2 at which the suction portion 22C suctioning the electronic component W to be detected by the holding state detection unit 130 is disposed is referred to as a "stop position SP2 for detection". In an example shown in FIG. 13, the stop position SP2 for detection is set to a stop position separated from the stop position SP2 for collecting by one angular pitch in a direction opposite to a turning direction of the turning unit 14. The camera 132 in the holding state detection unit 130 of the processing apparatus 1B is disposed such that the electronic component W suctioned by the suction portion 22C disposed at the stop position SP2 for detection is imaged.

The region detection unit 150 detects the pocket 174a which is a region of the carrier tape 174 in which the electronic component W is to be stored. For example, the region detection unit 150 detects the position of the pocket 174a after the carrier tape 174 is moved such that the empty pocket 174a is disposed vertically below the stop position SP2 for collecting (transfer position P2). The region detection unit 150 detects the position (deviation) of the pocket 174a with respect to an ideal position of the pocket 174a disposed at the transfer position P2. The ideal position of the pocket 174a is set such that, for example, the center of the pocket 174a in the plan view is positioned vertically below the stop position SP2 for collecting.

The region detection unit 150 may include a camera 152. The camera 152 is disposed such that the empty pocket 174a in which the electronic component W is to be stored is imaged. The camera 152 is disposed outside the circular track CR above the rotary conveyance unit 10C, for example. The camera 152 includes an imaging element such as a CCD image sensor or a CMOS image sensor, and a lens that forms an image on the imaging element. The camera 152 acquires an image of the pocket 174a in a state (timing) in which none of the members are positioned in an optical path between the transfer position P2 (empty pocket 174a) and the camera 152.

The second state information acquisition unit 222 of the controller 200 detects, by the holding state detection unit 130, information indicating the holding state (for example, the inclination and the position) of the electronic component W suctioned by the suction portion 22C disposed at the stop position SP2 for detection. For example, the second state information acquisition unit 222 causes the camera 132 of the holding state detection unit 130 to acquire an image of the main surface Wa of the electronic component W in a state in which any one of the suction portions 22C suctioning the electronic component W is disposed at the stop position SP2 for detection.

The third state information acquisition unit 224 of the controller 200 detects, by the region detection unit 150, information indicating a state (for example, a position) of the empty pocket 174a in which the electronic component W on the carrier tape 174 is to be stored. For example, the third state information acquisition unit 224 causes the camera 152 of the region detection unit 150 to acquire the image of the pocket 174a (image including at least an opening edge of the pocket 174a) after the carrier tape 174 is moved such that the empty pocket 174a storing the electronic component W to be adjusted is disposed at the transfer position P2.

The posture control unit 208 controls the corresponding rotation drive unit 18 so as to adjust an inclination of the electronic component W according to a detection result of an inclination around the axis Ax2 of the electronic component W suctioned by the suction portion 22C. More specifically, the posture control unit 208 controls the corresponding rotation drive unit 18 such that the inclination of the electronic component W held by the suction portion 22C approaches zero (a posture of the electronic component W approaches an ideal state) before the electronic component W to be adjusted is delivered to the carrier tape 174. By bringing the inclination of the electronic component W close to zero, for example, when the electronic component W is stored in the pocket 174a, it is possible to reduce a possibility that the electronic component W comes into contact with the opening edge of the pocket 174a due to the inclination of the electronic component W and cannot be stored in the pocket 174a.

In order to sequentially dispose the plurality of pockets 174a at the transfer position P2, the second position control unit 214 controls the container holder 162 such that the carrier tape 174 repeats the movement and the stop at the pitch interval between the centers of the adjacent pockets 174a. The second position control unit 214 controls the container position adjuster 164 according to the position of the empty pocket 174a in which the electronic component W is to be stored and a position of the electronic component W suctioned by the suction portion 22C. More specifically, when the electronic component W is stored in the pocket 174a, the second position control unit 214 causes the container position adjuster 164 to move the container holder 162 (carrier tape 174) in accordance with the position of the pocket 174a and the position of the electronic component W such that a deviation between each of the position of the pockets 174a and the position of the electronic component W approaches zero. When the electronic component W is stored in the pocket 174a, by bringing the deviation between the position of the pocket 174a and the position of the electronic component W close to zero, it is possible to reduce the possibility that the electronic component W comes into contact with the opening edge of the pocket 174a due to the deviation of the relative position of the electronic component W with respect to the pocket 174a and cannot be stored in the pocket 174a.

Figure 15:
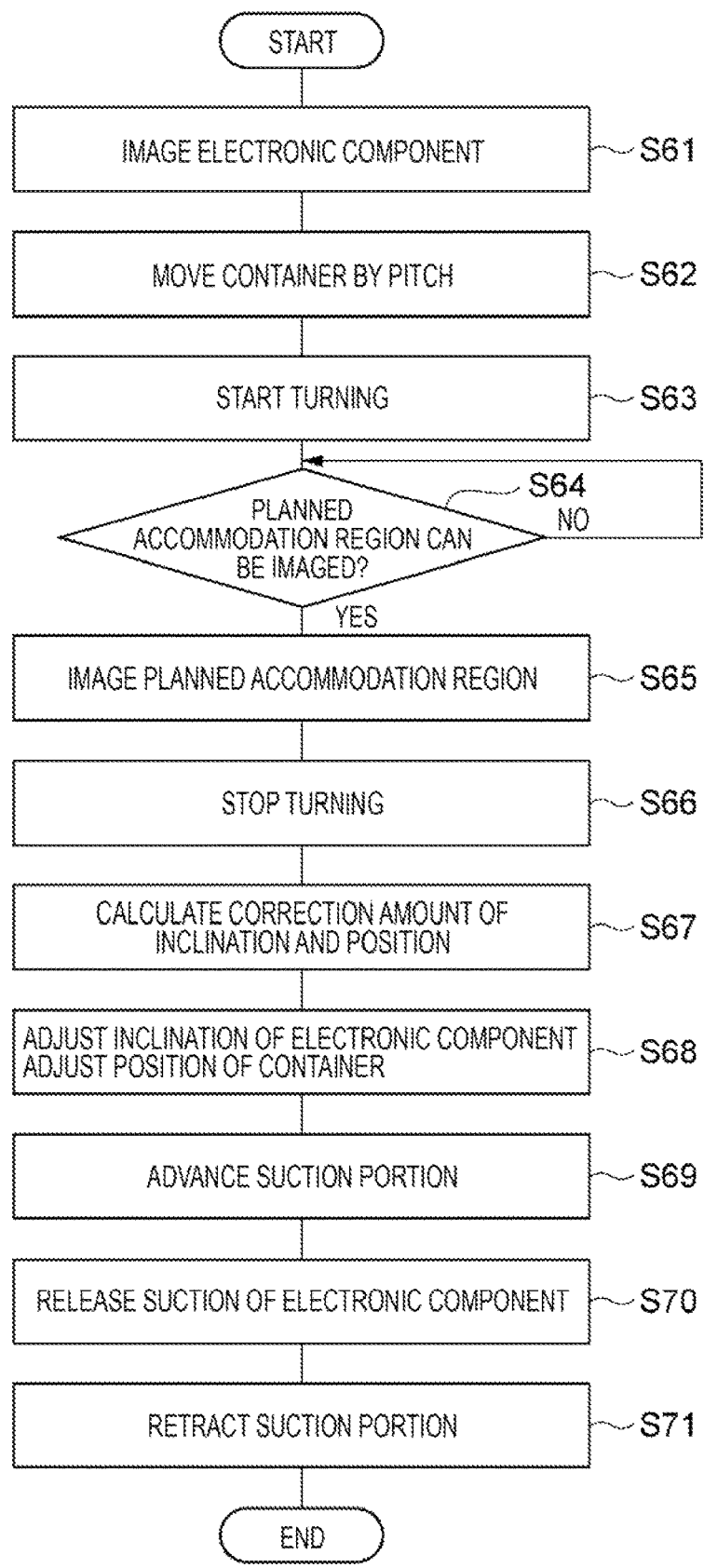
FIG. 15 is a flowchart illustrating an example of a series of processes until a suction portion transfers the electronic component.

Next, as an example of a method for processing an electronic component (control procedure executed by the controller 200), a series of processes until the suction portion 22C transfers the electronic component W will be described. FIG. 15 is a flowchart illustrating an example of the series of processes until one suction portion 22C transfers the electronic component W.

The controller 200 sequentially executes steps S61 and S62 in a state in which the suction portion 22C suctioning the electronic component W is disposed at the stop position SP2 for detection. In step S61, for example, the second state information acquisition unit 222 causes the camera 132 of the holding state detection unit 130 to acquire an image of the electronic component W suctioned by the suction portion 22C disposed at the stop position SP2 for detection. In step S62, for example, the second position control unit 214 controls the container position adjuster 164 such that the pocket 174a, which is a region in which the electronic component W of which the image is acquired in step S61 is to be stored, is disposed at the transfer position P2.

Next, the controller 200 sequentially executes steps S63 and S64. In step S63, for example, the turning control unit 202 causes the turning drive unit 16 to start turning of the turning unit 14 by one angular pitch on the circular track CR2 in the rotary conveyance unit 10C. In step S64, for example, the third state information acquisition unit 224 waits until imaging of the pocket 174a in which the electronic component W is to be stored becomes possible. In one example, the third state information acquisition unit 224 waits until a timing at which none of the members are positioned on the optical path between the pocket 174a in which the electronic component W is to be stored and the camera 152 of the region detection unit 150. The timing is stored in advance in the controller 200, for example.

Next, the controller 200 sequentially executes steps S65 and S66. In step S65, for example, the third state information acquisition unit 224 causes the camera 152 to acquire the image of the pocket 174a in which the electronic component W on the carrier tape 174 is to be stored. In step S66, for example, the turning control unit 202 causes the turning drive unit 16 to stop the turning of the turning unit 14 by the one angular pitch on the circular track CR2. Through the processing up to step S66, the suction portion 22C suctioning the electronic component W to be collected is disposed at the stop position SP2 for collecting.

Next, the controller 200 executes step S67. In step S67, for example, the posture control unit 208 calculates a correction amount of the inclination of the electronic component W according to the inclination of the electronic component W detected based on the image obtained in step S61. The posture control unit 208 calculates the correction amount of the inclination of the electronic component W such that the inclination of the electronic component W approaches zero (such that the posture of the electronic component W approaches the ideal state).

In step S67, for example, the second position control unit 214 calculates a correction amount of the position of the container holder 162 (carrier tape 174) according to the position of the electronic component W detected based on the image obtained in step S61 and the position of the pocket 174a detected based on the image obtained in step S65. In one example, the second position control unit 214 calculates the correction amount of the position of the container holder 162 such that the deviation between the position of the pocket 174a and the position of the electronic component W approaches zero when the electronic component W is stored in the carrier tape 174.

Next, the controller 200 executes step S68. In step S68, for example, the posture control unit 208 controls the corresponding rotation drive unit 18 so as to rotate the electronic component W (suction portion 22C) around the axis Ax2 by the correction amount (rotation amount according to the correction amount) of the inclination calculated in step S67. In step S68, the second position control unit 214 controls the container position adjuster 164 so as to move the container holder 162 (carrier tape 174) by the correction amount (movement amount according to the correction amount) of the position calculated in step S67.

Next, the controller 200 sequentially executes steps S69, S70, and S71. For example, in step S69, the second delivery control unit 218 causes the advance and retract driving portion 28b to advance the suction portion 22C disposed at the stop position SP2 for collecting to an outside of the circular track CR2 until the electronic component W suctioned by the suction portion 22C is stored in the pocket 174a. In step S70, for example, the second delivery control unit 218 causes the suction portion 22C to release the suction of the electronic component W stored in the pocket 174a. In step S71, for example, the second delivery control unit 218 causes the advance and retract driving portion 28b to retreat the advanced suction portion 22C. By executing steps S69 to S71, the electronic component W is delivered from the suction portion 22C to the carrier tape 174.

The controller 200 may also execute the series of processes of steps S61 to S71 for the other suction portions 22C (other electronic components W). Accordingly, the plurality of suction portions 22C sequentially transfer one electronic component W to the carrier tape 174. The controller 200 may start the series of processes of steps S61 to S71 for the other suction portions 22C (suction portions 22C that transfer the subsequent electronic components W) from the middle of the series of processes of steps S61 to S71 for the one suction portion 22C (for example, after the execution of step S66).

Instead of or in addition to the position of the empty pocket 174a at the transfer position P2, the region detection unit 150 may detect a position of an empty pocket 174a that is a region in which the electronic component W to be collected next is to be stored before the pocket 174a is disposed at the transfer position P2. For example, the region detection unit 150 may detect the position of the pocket 174a immediately before the empty pocket 174a in which the electronic component W to be adjusted is to be stored is disposed at the transfer position P2 (before the empty pocket 174a is disposed at the transfer position P2 by the movement of one pitch between the centers of the adjacent pockets 174a). When the empty pocket 174a is disposed at the transfer position P2, the second position control unit 214 may cause the container holder 162 and the container position adjuster 164 to move the carrier tape 174 according to the position of the empty pocket 174a and the position of the electronic component W such that the positional deviation between the electronic component W and the pocket 174a approaches zero. The region detection unit 150 may detect a posture of the pocket 174a instead of or in addition to the position of the empty pocket 174a.

The processing apparatus 1B may include one or more other rotary conveyance units in addition to the rotary conveyance units 10B and 10C. The central axes of the circular tracks formed by the plurality of rotary conveyance units in the processing apparatus 1B may all be along a horizontal line or a vertical line. The central axes of the circular tracks formed by some of the rotary conveyance units may extend along the horizontal line, and the central axes of the circular tracks formed by the remaining some of the rotary conveyance units may extend along the vertical line. The central axes of the circular tracks of at least a part of the plurality of rotary conveyance units may be inclined with respect to the vertical line or the horizontal line, and inclination angles of the central axes may be different from each other. In the rotary conveyance units other than the rotary conveyance unit that transfers the electronic component W to the component collecting unit 60B, each of the plurality of component holders (for example, the plurality of suction portions) positioned in the circular tracks may hold (for example, suction) the electronic component W from one side in a direction along the central axis of the circular track.

In the processing apparatus 1B, similarly to the processing apparatus 1A according to the second embodiment, the posture of the electronic component W suctioned by the suction portion 22C is also adjusted by rotating the suction portion 22C which suctions the electronic component W positioned outside the circular track CR2 around the axis Ax2. Therefore, the electronic component W can be transferred by the suction portion 22C while the posture of the electronic component W is brought close to the ideal state. Therefore, in the case in which the electronic component W is delivered to and from the suction portion 22C, it is useful to prevent the deviation of the posture of the electronic component W when the electronic component W is delivered.

REFERENCE SIGNS LIST 1, 1A, 1B processing apparatus of electronic component
W electronic component
CR, CR1, CR2 circular track
12 component holder
14 turning unit
16 turning drive unit
18 rotation drive unit 22, 22A, 22B, 22C suction portion
28a, 28b advance and retract driving portion
Ax1, Ax11, Ax12, Ax2 axis
32, 62 container holder
34, 64 container position adjuster
42, 72 container
110 posture detection unit
120 storage state detection unit
130 holding state detection unit
140, 150 region detection unit

The invention claimed is:

1. A processing apparatus for an electronic component comprising:
  a rotary conveyance unit; and
  a component supply unit,
  the rotary conveyance unit comprising:
    a component holder configured to hold the electronic component;
    a turning unit configured to hold the component holder toward an outside of a predetermined circular track;
    a container holder configured to hold a container that stores the electronic component supplied to the component holder;
    a position adjuster configured to change a position of the container holder;
    a storage state detection unit configured to detect a storage state of the electronic component stored in the container;
    a turning drive unit configured to turn the turning unit around a first axis along a central axis of the predetermined circular track;
    a rotation drive unit provided on the turning unit and configured to rotate the component holder around a second axis along a radial direction of the predetermined circular track; and
    a posture detection unit arranged to be apart from the turning unit so that the posture detection unit does not move with a turning of the turning unit, and configured to detect an inclination of the component holder around the second axis by acquiring information of an outer shape of the component holder based on light irradiated on the component holder; and
  the component supply unit comprising:
    a pushing pin that pushes the container such that the electronic component is transferred from the container to the component holder.

2. The processing apparatus according to claim 1, further comprising:
  an advance and retract driving portion configured to move both the component holder and the rotation drive unit along the radial direction of the predetermined circular track.

3. The processing apparatus according to claim 1, wherein the turning drive unit is configured to turn the turning unit around the first axis so that the component holder repeats moving and stopping along the predetermined circular track, and
  wherein the posture detection unit is configured to detect the inclination of the component holder around the second axis at a stop position where the component holder stops in a path in the predetermined circular track in which the component holder in a state of not holding the electronic component passes.

4. The processing apparatus according to claim 1, wherein the posture detection unit is configured to detect the inclination of the component holder around the second axis based on received light after irradiating a surface of the component holder with light, the surface of the component holder being a surface which is not held by the turning unit and which is different from a surface facing toward the outside of the predetermined circular track.

5. The processing apparatus according to claim 1, wherein the posture detection unit is configured to detect the inclination of the component holder around the second axis by capturing a surface of the component holder which is not held by the turning unit.

6. A processing apparatus for an electronic component comprising:
  a rotary conveyance unit; and
  a component supply unit,
  wherein the rotary conveyance unit comprises:
    a component holder including a suction portion configured to hold the electronic component;
    a turning unit configured to hold the component holder toward an outside of a predetermined circular track;
    a turning drive unit configured to turn the turning unit around a first axis along a central axis of the predetermined circular track;
    a rotation drive unit provided on the turning unit and configured to rotate the component holder around a second axis along a radial direction of the predetermined circular track;
    a posture detection unit arranged to be apart from the turning unit so that the posture detection unit does not move with a turning of the turning unit, and configured to detect an inclination of the component holder around the second axis by acquiring information of an outer shape of the component holder based on light irradiated on the component holder;
    a container holder configured to hold a container that stores the electronic component supplied to the component holder such that the container faces the component holder; and
    a position adjuster configured to change a position of the container holder along a plane intersecting a direction in which the container and the component holder face each other, and
  wherein detecting the inclination of the component holder comprises:
    detect inclination of the suction portion;
    calculate correction amount of the inclination; and
    rotate and convey the suction portion and adjust posture of the suction portion.

7. The processing apparatus according to claim 1, wherein a non-contactable range is set substantially at a center of a main surface of the electronic component in one width direction to be conveyed by the rotary conveyance unit.

8. The processing apparatus according to claim 6, wherein a non-contactable range is set substantially at a center of a main surface of the electronic component in one width direction to be conveyed by the rotary conveyance unit.

* * * * *